United States Patent
Tanabe et al.

(10) Patent No.: US 6,319,860 B1
(45) Date of Patent: *Nov. 20, 2001

(54) PROCESS FOR MANUFACTURING SEMICONDUCTOR INTEGRATED CIRCUIT DEVICE INCLUDING TREATMENT OF GAS USED IN THE PROCESS

(75) Inventors: Yoshikazu Tanabe, Iruma; Toshiaki Nagahama, Akishima; Nobuyoshi Natsuaki, Higashiyamato; Yasuhiko Nakatsuka, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/551,551

(22) Filed: Apr. 18, 2000

Related U.S. Application Data

(63) Continuation of application No. 09/089,398, filed on Jun. 3, 1998, now Pat. No. 6,066,508.

(30) Foreign Application Priority Data

Jun. 6, 1997 (JP) .................................................. 9-148734

(51) Int. Cl.[7] .......................... H01L 21/26; H01L 21/324; H01L 21/4763
(52) U.S. Cl. .......................... 438/795; 438/38; 438/296; 438/585; 438/648; 438/655; 438/773
(58) Field of Search ........................... 438/795, 38, 296, 438/585, 648, 655, 773

(56) References Cited

U.S. PATENT DOCUMENTS

| | | |
|---|---|---|
| 4,356,622 | 11/1982 | Widmann ............................ 438/655 |
| 4,505,028 | 3/1985 | Kobayashi . |
| 5,063,168 | 11/1991 | Vora ..................................... 438/655 |
| 5,088,314 | 2/1992 | Takashi .............................. 73/23.21 |
| 5,202,096 | 4/1993 | Jain ..................................... 423/248 |
| 5,576,228 | 11/1996 | Chen et al. .......................... 438/655 |
| 6,066,508 * | 5/2000 | Tanabe et al. ......................... 438/38 |
| 6,197,702 * | 3/2001 | Tanabe et al. ....................... 438/773 |

FOREIGN PATENT DOCUMENTS

| | | |
|---|---|---|
| 59-132136 | 7/1984 | (JP) . |
| 61-32429 | 2/1986 | (JP) . |
| 5152282 | 6/1993 | (JP) . |
| 883772 | 3/1996 | (JP) . |
| 975651 | 3/1997 | (JP) . |

\* cited by examiner

Primary Examiner—Matthew Smith
Assistant Examiner—Igwe U. Anya
(74) Attorney, Agent, or Firm—Antonelli, Terry, Stout & Kraus, LLP

(57) ABSTRACT

In a gas-phase treating process of a semiconductor wafer using hydrogen, there is provided a technique for safely eliminating the hydrogen in an exhaust gas discharged from a gas-phase treating apparatus. The profile at the end portions of the side walls of gate electrodes of a poly-metal structure is improved by forming the gate electrodes over a semiconductor wafer 1A having a gate oxide film and then by supplying the semiconductor wafer 1A with a hydrogen gas containing a low concentration of water, as generated from hydrogen and oxygen by catalytic action, to oxidize the principal face of the semiconductor wafer 1A selectively. After this, the hydrogen in the exhaust gas, as discharged from an oxidizing furnace, is completely converted into water by causing it to react with oxygen by a catalytic method.

35 Claims, 27 Drawing Sheets

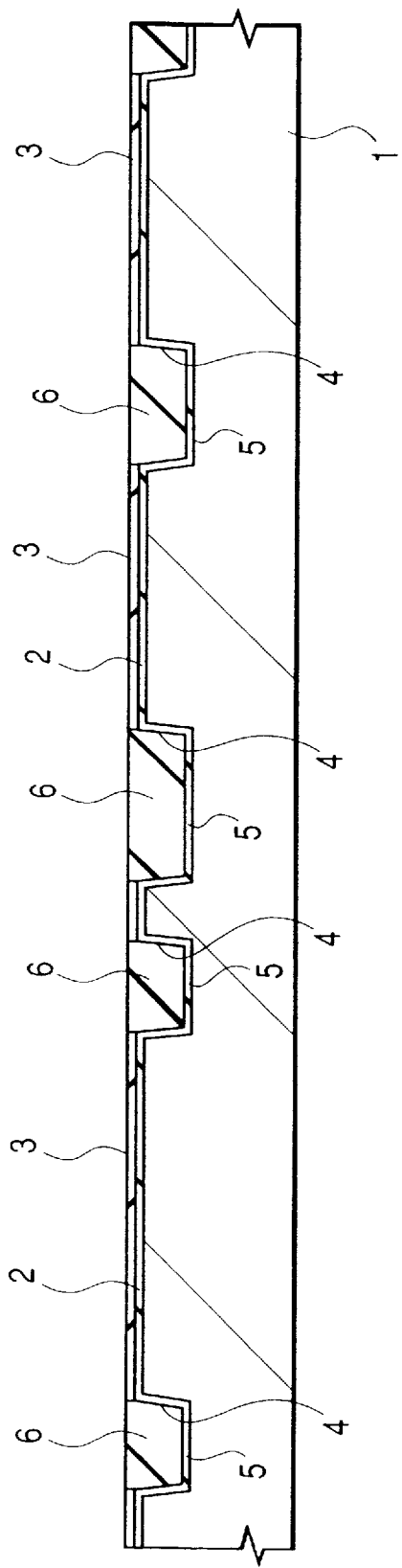
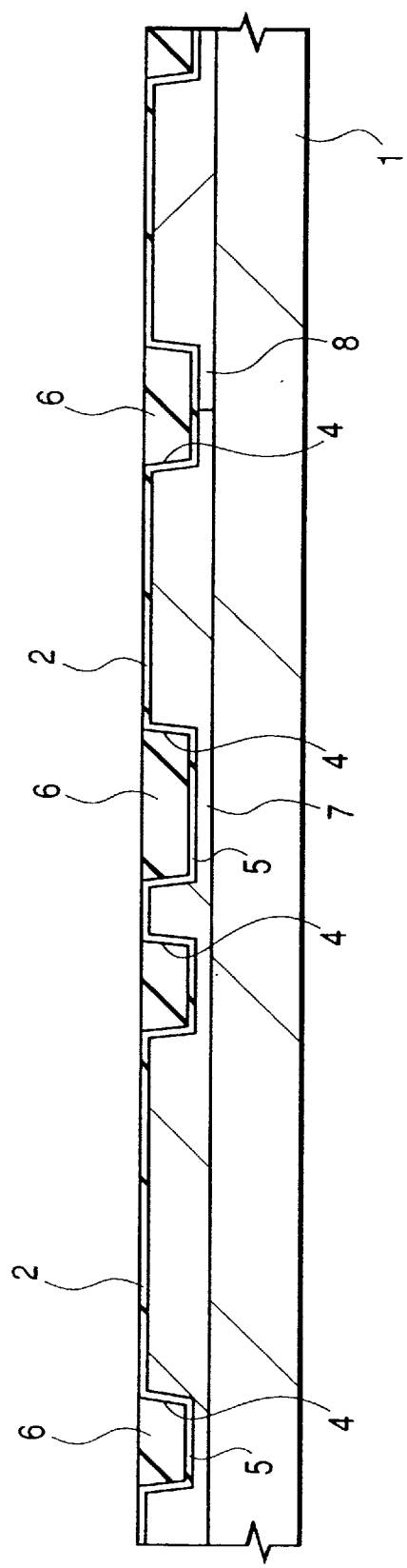

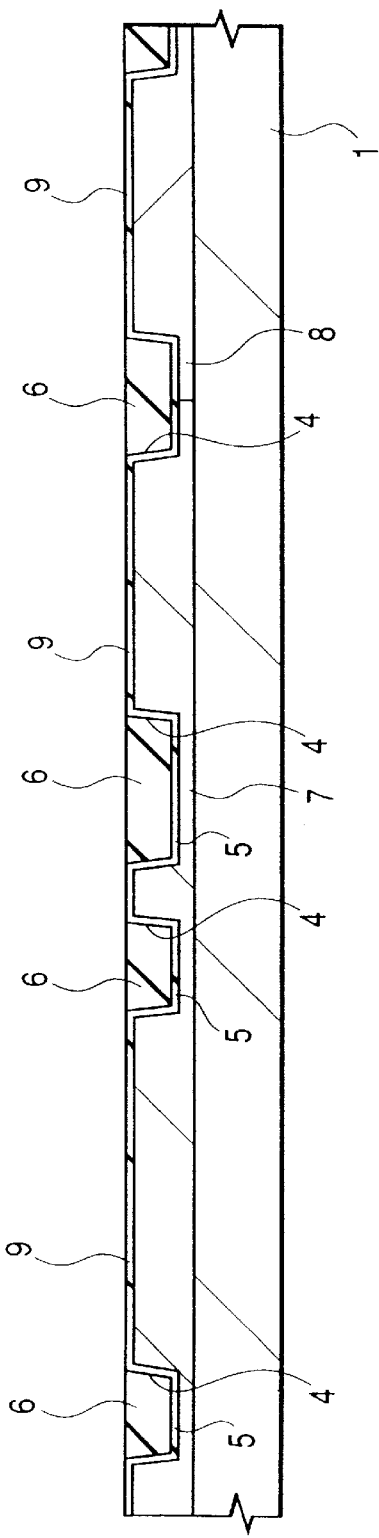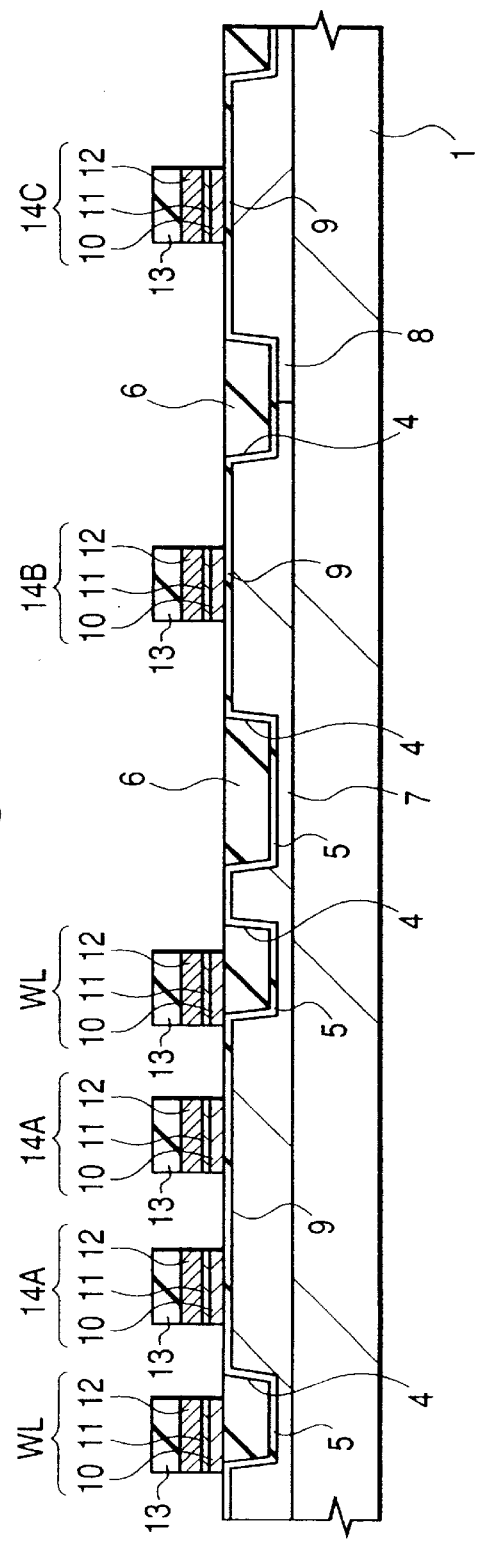

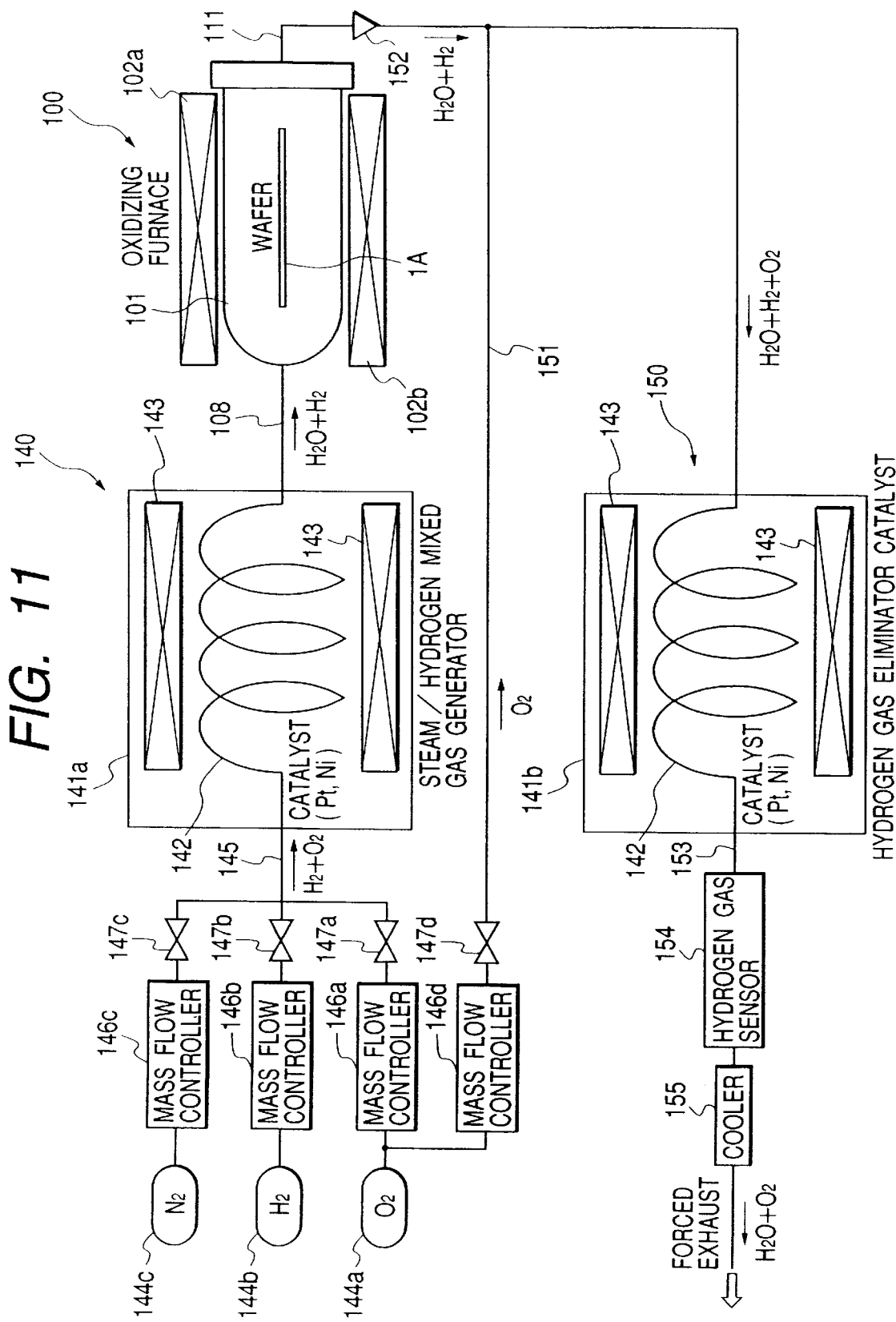

(a) $W + 3H_2O \rightleftarrows WO_3 + 3H_2$
(b) $Mo + 2H_2O \rightleftarrows MoO_2 + 2H_2$
(c) $2Ta + 5H_2O \rightleftarrows Ta_2O_5 + 5H_2$
(d) $Si + 2H_2O \rightleftarrows SiO_2 + 2H_2$
(e) $Ti + 2H_2O \rightleftarrows TiO_2 + 2H_2$

PROCESS FOR MANUFACTURING SEMICONDUCTOR INTEGRATED CIRCUIT DEVICE INCLUDING TREATMENT OF GAS USED IN THE PROCESS This application is a Continuation application of Ser. No. 09/089,398, filed Jun. 3, 1998 now U.S. Pat. No. 6,666,508.

BACKGROUND OF THE INVENTION

The present invention relates to a process for manufacturing a semiconductor integrated circuit device and, more particularly, to a technique which is effective when applied to a gas-phase treating process for a semiconductor wafer using a hydrogen gas.

In a semiconductor manufacturing process, it is known to use a hydrogen-annealing treatment for feeding hydrogen to a polycrystalline silicon film for constructing the gate electrodes of a MOSFET (Metal Oxide Semiconductor Field Effect Transistor) and a Si (silicon) substrate. For this hydrogen annealing treatment, the hydrogen gas is introduced into a batch type or sheet type hydrogen-annealing furnace housing a semiconductor wafer to heat-treat this semiconductor wafer. In a hydrogen atmosphere at about 400°. After this hydrogen-annealing treatment, the trap level, as caused by the dangling bonds (or uncoupled bonds) of Si, is terminated by the hydrogen so that the characteristics of the MOSFET are improved.

In the prior art, the hydrogen gas, as discharged from the hydrogen-annealing furnace, is eliminated by a combustion method. In this regard, air is introduced into the exhaust line of the hydrogen-annealing apparatus to burn and convert the hydrogen into water by the spark ignition method. In a hydrogen-annealing furnace of a relatively small scale, on the other hand, the discharged hydrogen may be diluted with a large amount of nitrogen gas or air and released to the atmosphere.

In a process for forming MOSFETs over a Si substrate, on the other hand, the Si substrate is wet-oxidized to form a gate oxide film on its surface. For this formation, there is also utilized a combustion method, in which water is generated by burning hydrogen in an oxygen atmosphere and the water is fed together with the oxygen to the surface of the semiconductor wafer.

For generating a water/hydrogen mixed gas to wet-oxide the Si substrate, a catalytic method is well known in the art in addition to 25, the combustion method. For example, Japanese Patent Laid-Open No. 5-152282/1993 (hereinafter to be called "Ohmi") has disclosed a thermal oxidizing apparatus in which a hydrogen gas inlet pipe is made at its inner face of Ni (nickel) or a Ni-containing material and which is equipped with means for heating the hydrogen gas inlet pipe. This thermal oxidizing apparatus generates water by bringing the hydrogen into contact with the Ni (or Ni-containing material) in the hydrogen gas inlet pipe heated to 300° C. or higher, to generate hydrogen activated species and by causing these hydrogen activated species and the oxygen (or the gas containing oxygen) to react with each other.

In a process for forming gate electrodes over the gate oxide film thus formed by the wet-oxidizing method, moreover, the gate electrode material, as deposited on the gate oxide film, is patterned by a dry-etching method. After this, the photoresist employed as the etching mask is eliminated by aching treatment, and the dry-etching residue or aching residue, as left on the surface of the substrate, is eliminated by an etching liquid, such as hydrofluoric acid.

With this wet-etching treatment, the gate oxide film is etched off not only from regions other than those under the gate electrodes, but also isotropically from the end portions of the side walls of the gate electrodes, thereby to cause an under-cut. This under-cut will cause, as it is, a defect in the form of a drop in the withstand voltage of the gate electrodes. In order to improve the profile of the under-cut end portions of the side walls of the gate electrodes, therefore, a so-called "light oxidation treatment" is performed to thermally oxidize the substrate again, thereby to form an oxide film on its surface.

If, however, the light oxidation treatment is applied to the gate electrodes of the poly-metal structure, which contains a refractory metal, such as W (tungsten) or Mo (molybdenum), that is liable to be oxidized in a hot oxygen atmosphere, the refractory metal film is oxidized to raise its resistance or is partially separated from the substrate. For a gate treating process using a poly-metal, therefore, there are required counter-measures for preventing the refractory metal film from being oxidized during the light oxidation treatment.

Japanese Patent Laid-Open No. 59-132136/1984 (hereinafter to be called "Kobayashi") has disclosed a technique for oxidizing Si selectively, but not a W (or Mo) film, by light-oxidizing the gate electrodes of the poly-metal structure including the W film or the Mo film over the Si substrate, in a mixed atmosphere of steam and hydrogen.

This technique utilizes the fact that the partial pressure ratio of steam/hydrogen for balancing the oxidizing/reducing reactions is different between W (Mo) and Si. The selective oxidation of Si is realized by setting the partial pressure ratio within a range wherein the W (Mo) may be oxidized with steam, but quickly reduced with the coexisting hydrogen, whereas the Si may be left oxidized. On the other hand, the steam/hydrogen mixed atmosphere is generated by the bubbling method of feeding the hydrogen gas to pure water contained in a container, and the steam/hydrogen partial pressure ratio is controlled by changing the temperature of the pure water.

In the light oxidation process, as disclosed, the Si substrate is oxidized with the steam/hydrogen mixed gas so that the hydrogen gas is contained in the exhaust gas discharged from the oxidizing furnace. In this case, too, there are required some counter-measures for eliminating the hydrogen gas from the exhaust gas.

Another well-known exhaust gas eliminating method, as employed in the semiconductor manufacturing process, is disclosed in Japanese Patent Laid-Open No. 8-83772/1996 (hereinafter to be called "Watanabe"). In this method, an exhaust gas containing tetraethoxysilane discharged from a CVD (Chemical Vapor Deposition) apparatus is guided into an adsorption tower to come into contact with a metal oxide catalyst (or an adsorbent carrying the catalyst) so that it may be oxidized and decomposed into a powder of silicon dioxide and diethyl ether. The metal oxide catalyst to be employed is exemplified by NiO, CuO, $Mn_2O_3$ or $Fe_2O_3$.

Moreover, Japanese Patent Laid-Open No. 9-75651/1997 (hereinafter to be called "Koyashiki") has disclosed a method in which a silane gas is eliminated as the powder of silicon dioxide by mixing and oxidizing an (water-soluble) ammonium gas and the silane gas with oxygen, in which the ammonia gas is eliminated by rinsing and in which the remaining noxious gases are adsorbed and eliminated with active carbon.

SUMMARY OF THE INVENTION

According to our investigations, in the aforementioned hydrogen-annealing process for a semiconductor wafer, the hydrogen gas to be discharged from a hydrogen-annealing furnace has to be ignited, after sufficient air was fed to the exhaust line, so that it may be eliminated by the combustion method. As a result, the flame is liable to go out when the supply of hydrogen gas becomes short, such as at the time of switching between the hydrogen gas and the purge gas, and the unburned hydrogen is discharged as it is to the outside. Since the hydrogen-annealing treatment is performed at a temperature as high as about 400° C., however, the amount of the unburned hydrogen in the hot exhaust gas may lead to the danger of explosion. Moreover, this hydrogen eliminating method by the use of combustion poses another problem in that the scale of the eliminator is enlarged.

On the other hand, the elimination method involving a diluting of the hydrogen gas, as discharged from the hydrogen-annealing furnace, with a large amount of nitrogen gas or air and discharging it to the atmosphere employs much diluting gas because the hydrogen gas concentration has to be lowered to about several percent for safety. This elimination method, like the combustion method, poses the problem that the scale of the eliminator is enlarged, and therefore is not suitable for eliminating a large amount of hydrogen gas.

Moreover, the method of Koyashiki using an adsorbent, such as active carbon, is environmentally defective because it will not convert a noxious substance into a safe one.

On the other hand, the method of Watanabe, which generates a powdery product which is troublesome to handle or a highly flammable substance, such as diethyl ether, is liable to cause problems if applied to a mass-production process.

An object of the invention is to provide a technique which, in a process for gas-phase treating a semiconductor wafer with a treating gas containing hydrogen, can eliminate the hydrogen safely from exhaust gas discharged from a gas-phase treating apparatus.

Another object of the invention is to provide a technique which, in a process for gas-phase treating a semiconductor wafer with a treating gas containing hydrogen, can eliminate the hydrogen efficiently from exhaust gas discharged from a gas phase treating apparatus.

The aforementioned and other objects and novel features of the invention will become apparent from the description to be made with reference to the accompanying drawings.

Representative features of the invention to be disclosed herein will be briefly summarized in the following.

(1) A process for manufacturing a semiconductor integrated circuit device according to the invention comprises: the step of gas-phase treating a semiconductor wafer with a treating gas containing hydrogen; and the step of eliminating the hydrogen, as contained in the gas-phase treated exhaust gas, by causing the hydrogen to react with oxygen by using a catalyst.

(2) In a semiconductor integrated circuit device manufacturing process of the invention, a hydrogen eliminator for eliminating the hydrogen contained in said exhaust gas is disposed in an exhaust line of a gas-phase treating device for gas-phase treating said semiconductor wafer.

(3) In a semiconductor integrated circuit device manufacturing process of the invention, said hydrogen eliminator is disposed at each exhaust line of said gas-phase treating unit.

(4) In a semiconductor integrated circuit device manufacturing process of the invention, one said hydrogen eliminator is disposed at the exhaust lines of a plurality of said gas-phase treating units.

(5) In a semiconductor integrated circuit device manufacturing process of the invention, the treatment of eliminating the hydrogen contained in said exhaust gas is performed by a single wafer process or a batch process.

(6) A process for manufacturing a semiconductor integrated circuit device according to the invention comprises: the step of forming gate electrodes of a MOSFET by depositing a conductive film containing at least a metal film on a gate oxide film formed over the principal face of a semiconductor substrate and by patterning said conductive film; the step of improving the profile of the end portions of the side walls of said gate electrodes by feeding a hydrogen gas containing steam, as generated from hydrogen and oxygen by catalytic action, to the principal face or the vicinity of said semiconductor substrate which is heated to a predetermined temperature, thereby to oxidize the principal face of said semiconductor substrate selectively; and the step of eliminating the hydrogen, as contained in the oxidized exhaust gas, by causing it to react with oxygen by using a catalyst.

(7) In a semiconductor integrated circuit device manufacturing process of the invention, the steam/hydrogen partial pressure ratio of the hydrogen gas containing said steam is set within such a range that said metal film may be reduced, whereas the principal face of said semiconductor substrate may be oxidized.

(8) In a semiconductor integrated circuit device manufacturing process of the invention, said conductive film includes at least a Ti film, and the principal face of said semiconductor substrate is selectively oxidized with the hydrogen gas containing steam of such a low concentration that the deterioration of said gate electrodes by the oxidation of said Ti film may be minimized.

(9) In a semiconductor integrated circuit device manufacturing process of the invention, said conductive film includes at least a W film, and the principal face of said semiconductor substrate is selectively oxidized with the hydrogen gas containing steam of such a low concentration as to be able to control the oxidation rate and the oxidized film thickness.

(10) In a semiconductor integrated circuit device manufacturing process of the invention, the conductive film constructing said gate electrodes includes a polycrystalline silicon film, a metal nitride film deposited on said polycrystalline silicon film, and a metal film deposited on said metal nitride film

(11) In a semiconductor integrated circuit device manufacturing process of the invention, said metal nitride film is made of WN or TiN, and said metal film is made of W, Mo or Ti.

(12) A process for manufacturing a semiconductor integrated circuit device according to the invention comprises: the step of forming gate electrodes of a MOSFET by depositing a conductive film including at least a metal film over a gate oxide film having a thickness of 5 nm or less and formed over the principal face of a semiconductor substrate and then by patterning said conductive film; the step of improving the profile of the end portions of the side walls of said gate electrodes by oxidizing the principal face of said semiconductor substrate selectively by feeding the hydrogen gas containing steam of such a low concentration, as is generated from hydrogen and oxygen by catalytic action and can control the reproductivity of the oxide film formation and the homogeneity of the oxide film thickness, to the principal face or the vicinity of said semiconductor substrate heated to a predetermined temperature, thereby to oxidize the principal face of said semiconductor substrate selectively; and the step of eliminating the hydrogen, as contained in the oxidized exhaust gas, by causing it to react with oxygen by using a catalyst.

(13) A process for manufacturing a semiconductor integrated circuit device according to the invention comprises: the step of forming one or more layers of wiring over the principal face of a semiconductor substrate and then depositing a passivation film on the wiring of the uppermost layer; the step of terminating the dangling bonds of Si with hydrogen by heat treating said semiconductor substrate in a gas atmosphere containing hydrogen in the course of or before or after the step of depositing said passivation film; and the step of eliminating the hydrogen, as contained in the heat treated exhaust gas, by causing it to react with oxygen by using a catalyst.

The remaining aspects of the invention will be itemized and briefly described in the following.

1. A process for manufacturing semiconductor integrated circuit device, comprising:
    (a) the step of treating a semiconductor integrated circuit wafer, as housed in a reaction furnace, in a gas atmosphere containing a hydrogen gas;
    (b) the step of discharging said gas atmosphere to the outside of said reaction furnace; and
    (c) the-step of converting the hydrogen gas, as contained in said atmosphere, into water by treating said discharged gas atmosphere with an oxidizing catalyst.

2. A process for manufacturing semiconductor integrated circuit device, comprising:
    (a) the step of treating a semiconductor integrated circuit wafer, as housed in a reaction furnace, in a gas atmosphere containing a combustible gas;
    (b) the step of discharging said gas atmosphere to the outside of said reaction furnace; and
    (c) the step of converting the said combustible gas, as contained in said atmosphere, into at least one non-combustible component exclusively by treating said discharged gas atmosphere with an oxidizing catalyst.

3. A process for manufacturing semiconductor integrated circuit device, comprising:
    (a) the step of treating a semiconductor integrated circuit wafer, as housed in a reaction furnace, with a gas atmosphere containing a combustible gas and steam synthesized by using a catalyst;
    (b) the step of discharging said gas atmosphere to the outside of said reaction furnace; and
    (c) the step of converting the said combustible gas, as contained in said atmosphere, into at least one non-combustible component exclusively by treating said discharged gas atmosphere with an oxidizing catalyst.

4. A process for manufacturing semiconductor integrated circuit device, comprising:
    (a) the step of thermally oxidizing a first region containing silicon as its major component selectively by heat treating a semiconductor integrated circuit wafer, which has said first region and a second region containing a refractory metal but not silicon as its major component, in a reaction furnace in a gas atmosphere containing a hydrogen gas and steam;
    (b) the step of discharging said gas atmosphere to the outside of said reaction furnace; and
    (c) the step of converting the hydrogen gas, as contained in said atmosphere, into water by treating said discharged gas atmosphere with an oxidizing catalyst.

5. A process for manufacturing semiconductor integrated circuit device, comprising:
    (a) the step of thermally oxidizing a first region selectively by heat treating a semiconductor integrated circuit wafer, which has said first region and a second region made of a material different from that of said first region, in a reaction furnace in a gas atmosphere containing a hydrogen gas and steam;
    (b) the step of discharging said gas atmosphere to the outside of said reaction furnace; and
    (c) the step of converting the hydrogen gas, as contained in said atmosphere, into water by treating said discharged gas atmosphere with an oxidizing catalyst.

6. A process for manufacturing semiconductor integrated circuit device, comprising:
    (a) the step of treating a semiconductor integrated circuit wafer, as housed in a reaction furnace, in a gas atmosphere containing a combustible gas;
    (b) the step of discharging said gas atmosphere to the outside of said reaction furnace; and
    (c) the step of converting the said combustible gas, as contained in said atmosphere, into at least one non-combustible component exclusively by treating said discharged gas atmosphere with an oxidizing catalyst in a catalytic treating chamber disposed in the vicinity of said reaction furnace.

7. A process for manufacturing a semiconductor integrated circuit device, comprising:
    (a) the step of forming a poly-silicon film over a gate insulating film including a silicon oxide film formed on the silicon surface of a semiconductor wafer;
    (b) the step of forming a refractory metal film containing tungsten as its major component directly or through a barrier layer over said poly-silicon film;
    (c) the step of forming gate electrodes by patterning said poly-silicon film and said refractory metal film;
    (d) the step of thermally oxidizing, additionally after said step (c), the silicon and poly-silicon portions in a mixed atmosphere containing a hydrogen gas and steam synthesized with a catalyst from oxygen and a hydrogen gas;
    (e) the step of discharging said mixed atmosphere to the outside of said thermally oxidizing region; and
    (f) the step of converting the hydrogen gas, as contained in said mixed atmosphere, into water by treating said discharged gas atmosphere with an oxidizing catalyst.

8. A process for manufacturing a semiconductor integrated circuit device, comprising:
    (a) the step of forming a poly-silicon film over a gate insulating film including a silicon oxide film formed on the silicon surface of a semiconductor wafer;
    (b) the step of forming a refractory metal film directly or through a barrier layer over said polysilicon film;
    (c) the step of forming gate electrodes by patterning said poly-silicon film and said refractory metal film;
    (d) the step of thermally oxidizing, additionally after said step (c), the silicon and poly-silicon portions in a mixed atmosphere containing a hydrogen gas and steam synthesized with use of a catalyst from oxygen and a hydrogen gas;
    (e) the step of discharging said mixed atmosphere to the outside of said thermally oxidizing region; and
    (f) the step of converting the hydrogen gas, as contained in said mixed atmosphere, into water by treating said discharged gas atmosphere with an oxidizing catalyst.

9. A process for manufacturing semiconductor integrated circuit device, comprising:
   (a) the step of heat treating a first region over a semiconductor wafer and a second region made of a material different from that of said first region in a mixed atmosphere containing a hydrogen gas and steam synthesized from oxygen and a hydrogen gas with use of a catalyst, so that said first region may be oxidized whereas said second region may not be substantially oxidized;
   (b) the step of discharging said mixed atmosphere to the outside of said thermally oxidizing region; and
   (c) the step of converting the hydrogen gas, as contained in said atmosphere, into water by treating said discharged gas atmosphere with an oxidizing catalyst.

10. A process for manufacturing a semiconductor integrated circuit device, comprising:
   (a) the step of forming a first film containing silicon as a major component over a gate insulating film including a silicon oxide film formed on the silicon surface of a semiconductor wafer;
   (b) the step of forming a refractory metal film directly or through a barrier layer over said first film;
   (c) the step of forming gate electrodes by patterning said first film and said refractory metal film;
   (d) the step of thermally oxidizing, additionally after said step (c), the silicon and poly-silicon portions in a mixed atmosphere containing a hydrogen gas and steam synthesized with use of a catalyst from oxygen and a hydrogen gas;
   (e) the step of discharging said mixed atmosphere to the outside of said thermally oxidizing region; and
   (f) the step of converting the hydrogen gas, as contained in said mixed atmosphere, into water by treating said discharged gas atmosphere with an oxidizing catalyst.

11. A process for manufacturing a semiconductor integrated circuit device, comprising:
   (a) the step of forming element isolating grooves in the silicon surface of a semiconductor integrated circuit;
   (b) the step of burying members from the outside in said element isolating grooves;
   (c) the step of flattening said wafer surface, after said step (b), by a chemical mechanical polishing method;
   (d) the step of forming a poly-silicon film over a gate insulating film containing a silicon oxide film formed on the silicon surface of said semiconductor wafer;
   (e) the step of forming a refractory metal film directly or through a barrier layer over said polysilicon film;
   (f) the step of forming gate films by patterning said poly-silicon film and said refractory metal film;
   (g) the step of thermally oxidizing, after said step (f), the silicon and poly-silicon portions in a mixed atmosphere containing a hydrogen gas and steam so that said refractory metal film may not be substantially oxidized;
   (h) the step of discharging said mixed atmosphere to the outside of said thermally oxidizing region; and
   (i) the step of converting the hydrogen gas, as contained in said mixed atmosphere, into water by treating said discharged gas atmosphere with use of an oxidizing catalyst.

12. A process for manufacturing a CMOS semiconductor integrated circuit device, comprising:
   (a) the step of forming a poly-silicon film over a gate insulating film containing a silicon oxide film formed on the silicon surface of a semiconductor wafer;
   (b) the step of forming a refractory metal film containing tungsten as a major component through a barrier layer containing a tungsten nitride film over said poly-silicon film;
   (c) the step of forming gate films by patterning said poly-silicon film and said refractory metal film;
   (d) the step of thermally oxidizing, after said step (c), the silicon and poly-silicon portions in a mixed atmosphere containing a hydrogen gas and steam so that said refractory metal film may not be substantially oxidized;
   (e) the step of discharging said mixed atmosphere to the outside of said thermally oxidizing region; and
   (f) the step of converting the hydrogen gas, as contained in said mixed atmosphere, into water by treating said discharged gas atmosphere with use of an oxidizing catalyst.

13. A process for manufacturing a CMOS semiconductor integrated circuit device, comprising:
   (a) the step of forming a poly-silicon film over a gate insulating film containing a silicon oxide film formed on the silicon surface of a semiconductor wafer;
   (b) the step of forming a refractory metal film containing tungsten as a major component through a barrier layer containing a tungsten nitride film over said poly-silicon film;
   (c) the step of forming gate electrodes by patterning said poly-silicon film and said refractory metal film;
   (d) the step of thermally oxidizing, after said step (c), the silicon and poly-silicon portions in a mixed atmosphere of a gas for oxidizing and reducing the silicon and the poly-silicon so that said refractory metal film may not be substantially oxidized;
   (e) the step of discharging said mixed atmosphere to the outside of said thermally oxidizing region; and
   (f) the step of converting said mixed atmosphere into a non-combustible atmosphere by treating said discharged gas atmosphere with use of an oxidizing catalyst.

14. A process for manufacturing a semiconductor integrated circuit device, comprising:
   (a) the step of forming a poly-silicon film over a gate insulating film containing a silicon oxide film formed on the silicon surface of a semiconductor wafer;
   (b) the step of forming a refractory metal film containing tungsten as a major component directly or through a barrier layer over said poly-silicon film;
   (c) the step of forming gate electrode by patterning said poly-silicon film and said refractory metal film;
   (d) the step of thermally oxidizing, additionally after said step (c), the silicon and poly-silicon portions in a mixed atmosphere of a gas for reducing the silicon and the poly-silicon and an oxidizing gas, as synthesized with use of an oxidizing catalyst, so that said refractory metal film may not be substantially oxidized;
   (e) the step of discharging said mixed atmosphere to the outside of said thermally oxidizing region; and
   (f) the step of converting said mixed atmosphere into a non-combustible atmosphere by treating said discharged gas atmosphere with use of an oxidizing catalyst.

15. A process for manufacturing semiconductor integrated circuit device, comprising:
   (a) the step of hydrogen-annealing a semiconductor integrated circuit wafer having a final passivation film, in a reaction furnace in a gas atmosphere containing a hydrogen gas;

(b) the step of discharging said gas atmosphere to the outside of said reaction furnace; and (c) the step of converting the hydrogen gas, as contained in said atmosphere, into water by treating said discharged gas atmosphere with an oxidizing catalyst.

16. A process for manufacturing semiconductor integrated circuit device, comprising:

(a) the step of heat treating a semiconductor integrated circuit wafer in a reaction furnace in a gas atmosphere containing a hydrogen gas and steam;

(b) the step of discharging said gas atmosphere to the outside of said reaction furnace; and (c) the step of converting the hydrogen gas, as contained in said atmosphere, into water by treating said discharged gas atmosphere with use of an oxidizing catalyst.

17. A semiconductor integrated circuit device manufacturing process according to claim 16, wherein said wafer is a silicon wafer prepared by the Czochralski method.

18. A semiconductor integrated circuit device manufacturing process according to claim 17, wherein said wafer is a wafer having a silicon epitaxial layer over a silicon substrate.

19. A semiconductor integrated circuit device manufacturing process according to claim 18, wherein said wafer is a wafer having a silicon epitaxial layer over a silicon substrate.

20. A semiconductor integrated circuit device manufacturing process according to claim 19, wherein the treatment with said catalyst is performed in a non-combustible temperature region of hydrogen.

21. A semiconductor integrated circuit device manufacturing process according to claim 20, wherein the feed and discharge of said atmosphere are performed either substantially simultaneously or continuously with the heat treatment.

22. A semiconductor integrated circuit device manufacturing process according to claim 21, wherein said heat treatment is performed in a temperature region of 700° C. or higher.

Moreover, the foregoing and other features will be itemized and briefly described from other aspects.

23. A process for manufacturing a semiconductor integrated circuit device comprises: the step of gas phase treating a semiconductor wafer with a treating gas containing hydrogen; and the step of eliminating the hydrogen, as contained in the gas-phase treated exhaust gas, by causing the hydrogen to react with oxygen by use of a catalyst.

24. In a semiconductor integrated circuit device manufacturing process as set forth in item 23, a hydrogen eliminator for eliminating the hydrogen contained in said exhaust gas is disposed in an exhaust line of a gas-phase treating device for gas phase treating said semiconductor wafer.

25. In a semiconductor integrated circuit device manufacturing process as set forth in item 24, said hydrogen eliminator is disposed at each exhaust line of said gas-phase treating unit.

26. In a semiconductor integrated circuit device manufacturing process as set forth in item 24, one said hydrogen eliminator is disposed at the exhaust lines of a plurality of said gas-phase treating units.

27. In a semiconductor integrated circuit device manufacturing process as set forth in item 23, the treatment of eliminating the hydrogen contained in said exhaust gas is performed by a single wafer process or a batch process.

28. A process for manufacturing a semiconductor integrated circuit device comprises: the step of forming gate electrodes of a MOSFET by depositing a conductive film containing at least a metal film on a gate oxide film formed over the principal face of a semiconductor substrate and by patterning said conductive film; the step of improving the profile of the end portions of the side walls of said gate electrodes by feeding a hydrogen gas containing steam, as generated from hydrogen and oxygen by catalytic action, to the principal face or the vicinity of said semiconductor substrate which is heated to a predetermined temperature, thereby to oxidize the principal face of said semiconductor substrate selectively; and the step of eliminating the hydrogen, as contained in the oxidized exhaust gas, by causing it to react with oxygen by use of a catalyst.

29. In a semiconductor integrated circuit device manufacturing process as set forth in item 28, the steam/hydrogen partial pressure ratio of the hydrogen gas containing said steam is set within such a range that said metal film may be reduced whereas the principal face of said semiconductor substrate may be oxidized.

30. In a semiconductor integrated circuit device manufacturing process as set forth in item 28, said conductive film includes at least a Ti film, and the principal face of said semiconductor substrate is selectively oxidized with the hydrogen gas containing steam of such a low concentration that the deterioration of said gate electrodes by the oxidation of said Ti film may be minimized.

31. In a semiconductor integrated circuit device manufacturing process as set forth in item 28, said conductive film includes at least a W film, and the principal face of said semiconductor substrate is selectively oxidized with the hydrogen gas containing steam of such a low concentration as to control the oxidation rate and the oxidized film thickness.

32. In a semiconductor integrated circuit device manufacturing process as set forth in item 28, the conductive film constructing said gate electrodes includes a polycrystalline silicon film, a metal nitride film deposited on said polycrystalline silicon film, and a metal film deposited on said metal nitride film.

33. In a semiconductor integrated circuit device manufacturing process as set forth in item 32, said metal-nitride film is made of WN or TiN, and said metal film is made of W, Mo or Ti.

34. A process for manufacturing a semiconductor integrated circuit device comprises: the step of forming gate electrodes of a MOSFET by depositing a conductive film including at least a metal film over a gate oxide film having a thickness of 5 nm or less and formed over the principal face of a semiconductor substrate and then by patterning said conductive film; the step of improving the profile of the end portions of the side walls of said gate electrodes by oxidizing the principal face of said semiconductor substrate selectively by feeding the hydrogen gas containing steam of such a low concentration, as is generated from hydrogen and oxygen by catalytic action and can control the reproducibility of the oxide film formation and the homogeneity of the oxide film thickness, to the principal face or the vicinity of said semiconductor substrate heated to a predetermined temperature, thereby to oxidize the principal face of said semiconductor substrate selectively; and the step of eliminating the hydrogen, as contained in the oxidized exhaust gas, by causing it to react with oxygen by use of a catalyst 35. A process for manufacturing a semiconductor integrated circuit device comprises: the step of 25 forming one or more layers of wiring over the principal face of a semiconductor substrate and then depositing a passivation film on the wiring of the uppermost layer; the step of terminating the dangling bonds of Si with hydrogen by heat treating said semiconductor substrate in a gas atmosphere containing hydrogen in the course of or before or after the step of depositing said passivation film; and the step of eliminating the hydrogen, as contained in the heat treated exhaust gas, by causing it to react with oxygen by use of a catalyst.

BRIEF DESCRIPTION OF THE DRAWINGS

FIG. 4 is a section of the essential portion of the semiconductor substrate and shows a step in the DRAM manufacturing process according to the invention;

FIG. 5 is a section of the essential portion of the semiconductor substrate and shows a step in the DRAM manufacturing process according to the invention;

FIG. 6 is a section of the essential portion of the semiconductor substrate and shows a step in the DRAM manufacturing process according to the invention;

FIG. 7 is a section of the essential portion of the semiconductor substrate and shows a step in the DRAM manufacturing process according to the invention;

FIG. 11 is a schematic diagram showing a catalytic type steam/hydrogen mixed gas generator and a hydrogen gas eliminator which are connected to the single wafer type oxidizing furnace;

DETAILED DESCRIPTION OF THE INVENTION

Figure 1:
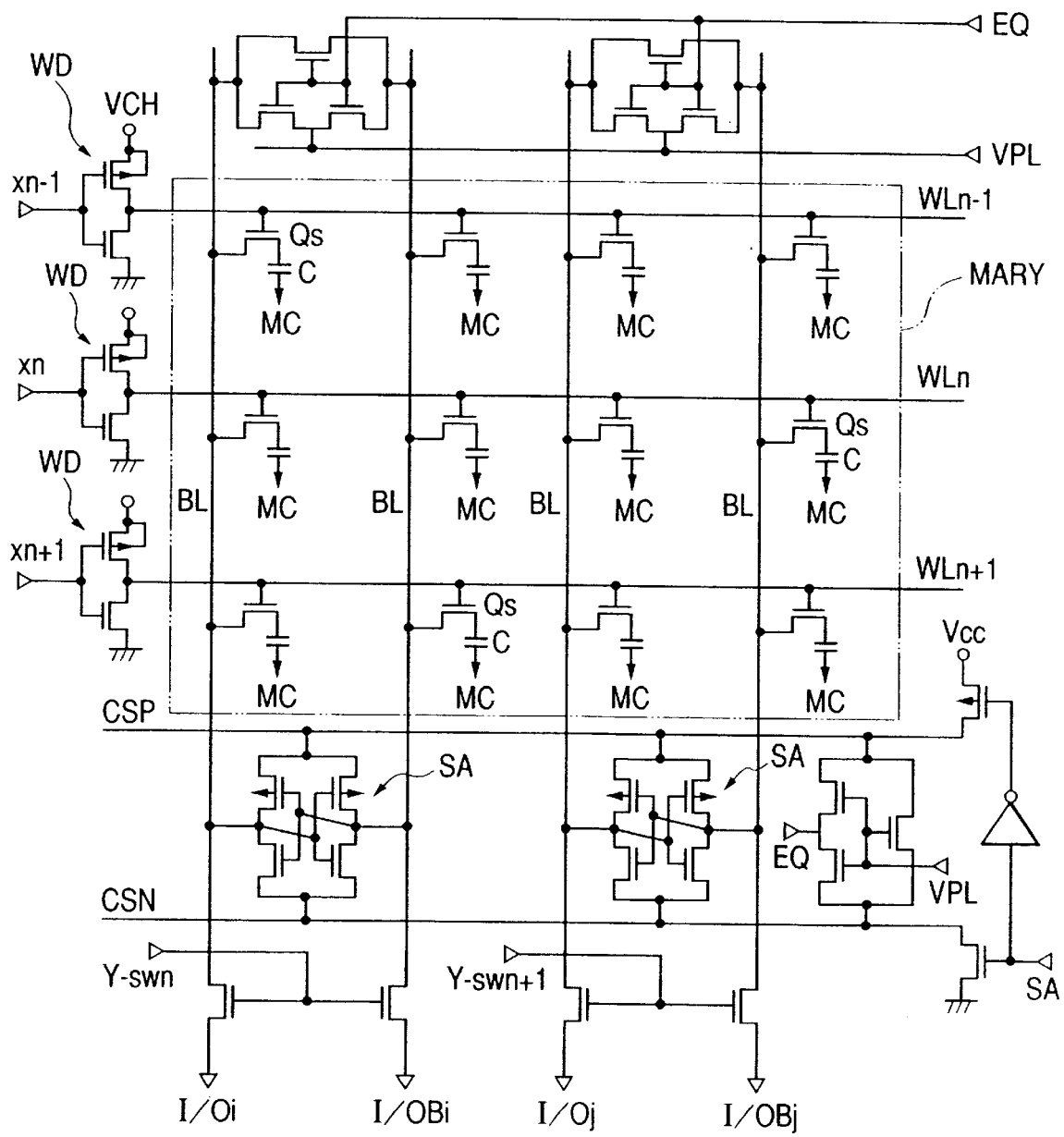
FIG. 1 is an equivalent circuit diagram showing a DRAM according to one embodiment of the invention.

The invention will be described in detail in connection with various embodiments with reference to the accompanying drawings. Throughout all the drawings for explaining the embodiments, however, the repeated description of members having identical functions will be omitted, while designating such members by identical reference numerals.

The description of identical or similar portions will not be repeated in the following description of the embodiments unless especially necessary.

Moreover, the following description, an embodiment will be described by dividing it into a plurality of sections or embodiments, if conveniently necessary, which embodiments are not to be considered independent of each other, unless explicitly specified so, but each one is to be considered in relation to the modifications, details, supplementary descriptions and so on of a portion or the entirety of another.

In the following description of the embodiments, moreover, when reference is made to a number value or the like (including a number, numerical value, quantity and range) of an element, the number should not be limited to a specific one, but may be more or less than the stated value unless it is explicitly specified or apparently limited on principle to the specific value.

In the following embodiments, still moreover, it is needless to mention that the components (including composing steps) are not always indispensable unless explicitly specified to be or are apparently indispensable on principle.

Likewise, in the following embodiments, when a mention is made of the shape or positional relation of a component, it should include a shape or the like substantially approximate or similar to the mentioned characteristic unless explicitly specified or apparently deemed otherwise on principle. This likewise applies to the aforementioned numerical value and range.

On the other hand, a semiconductor integrated circuit device should include, when mentioned herein, not only one formed over a silicon wafer, but also one formed over another type of substrate, such as TFT liquid crystal or the like, unless otherwise explicitly specified. Excepting this explicit denial, therefore, a semiconductor integrated circuit wafer, a semiconductor wafer or simply a wafer should include a variety of the above-specified plate-shaped materials.

FIG. 1 is an equivalent circuit diagram of a DRAM according to one embodiment of the present invention. As shown, a memory array (MARY) of the DRAM is equipped with a plurality of word lines WL (WLn−1, WLn, WLn+1, - - - , and so on) and a plurality of bit lines BL, arranged in a matrix shape, and a plurality of memory cells (MC) are arranged at the junctions of those lines. One memory cell for storing information of one bit is constructed to include one information storing capacity element C and one memory cell selecting MISFET Qs connected in series with the capacity element C. One of the source and drain of the memory cell selecting MISFET Qs is electrically connected with the information storing capacity element C, and the other is electrically connected with the bit line BL. One end of the word line WL is connected with a word driver WD, and one end of the bit line BL is connected with a sense amplifier SA.

Figure 12:
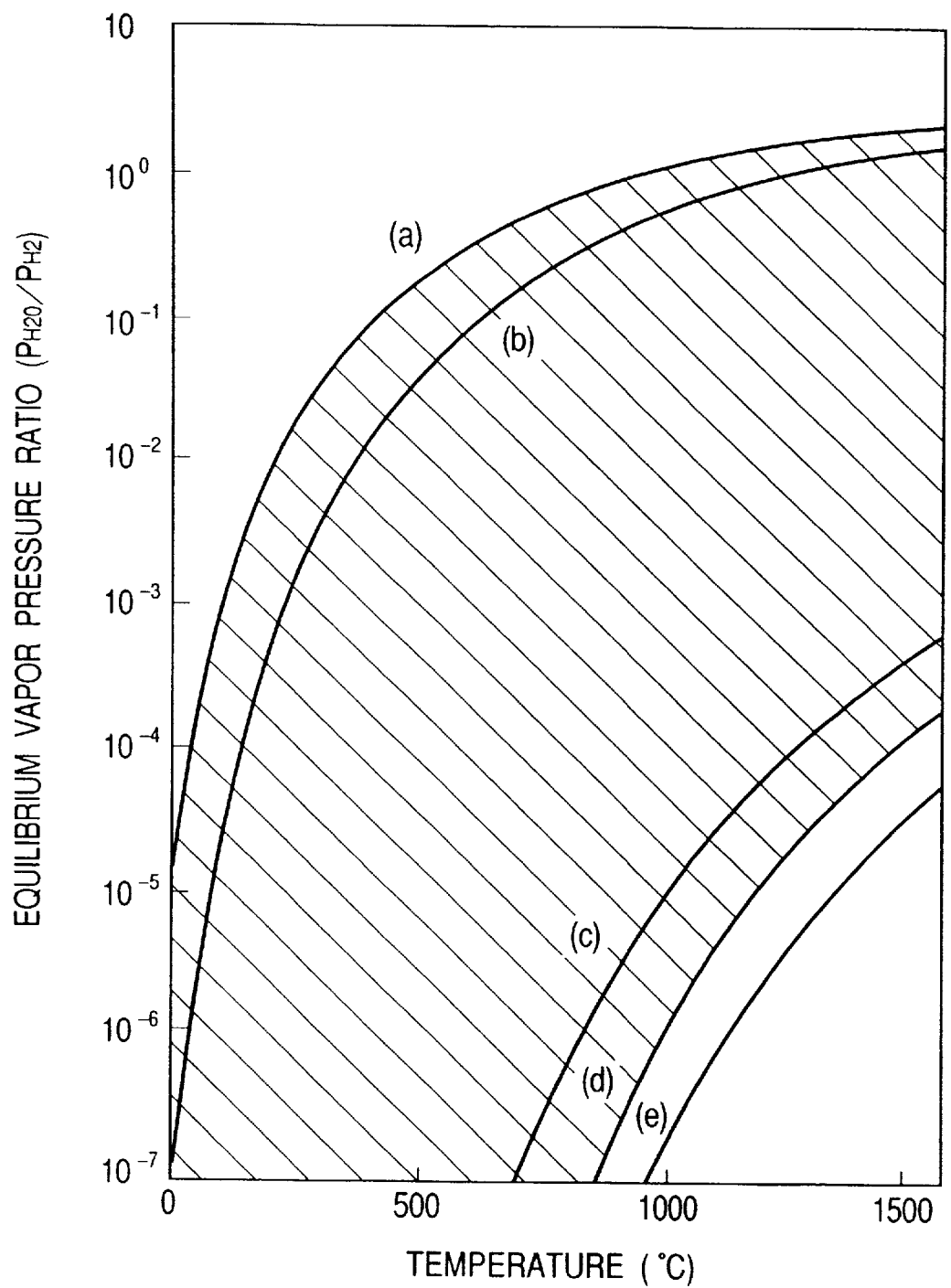
FIG. 12 is a graph illustrating temperature dependencies of an equilibrium vapor pressure ratio of oxidizing/reducing reactions using steam/hydrogen mixed gases.
Figure 13:
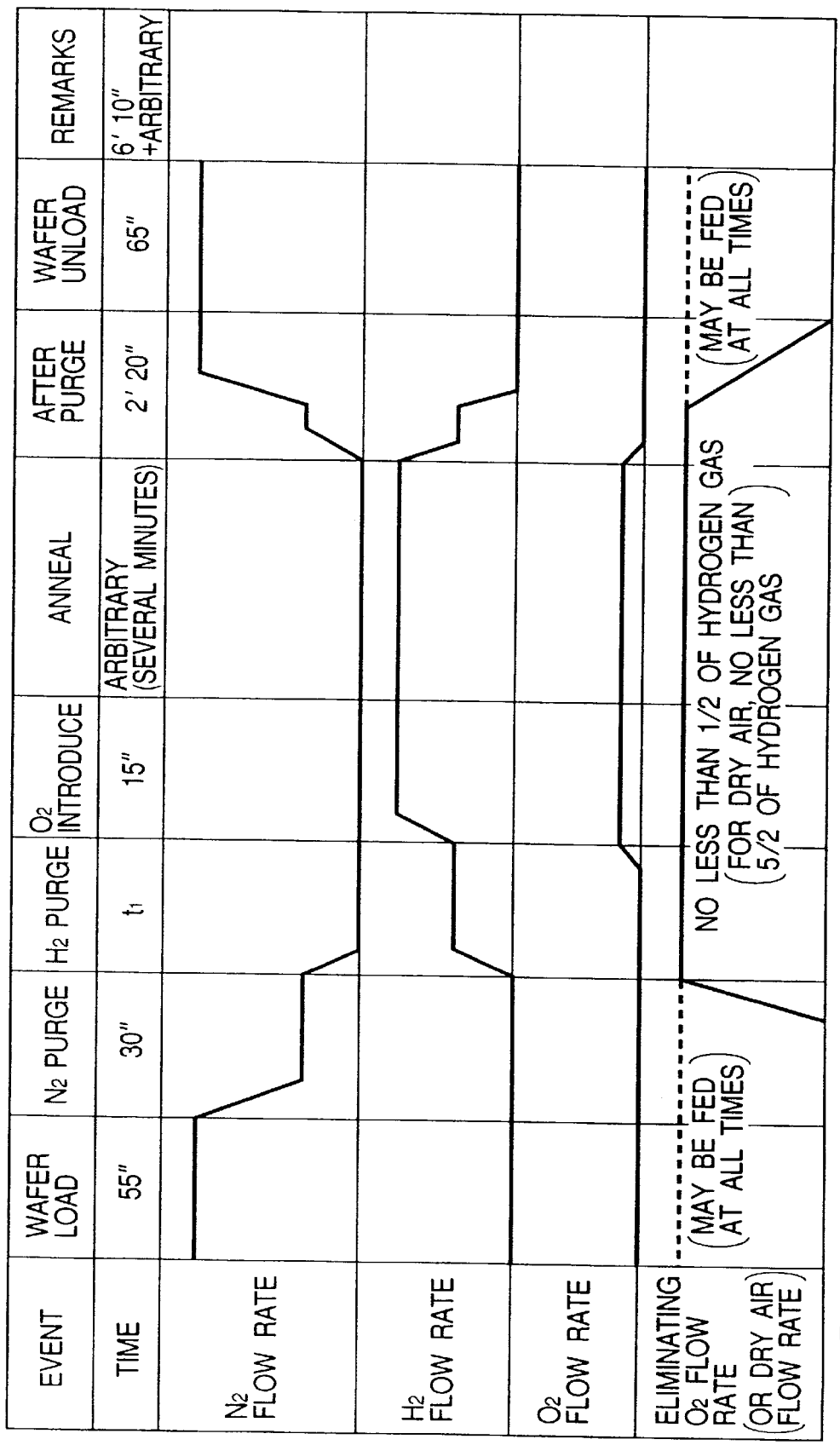
FIG. 13 is a diagram showing a light oxidation process using a single wafer type oxidizing furnace.
Figure 28:
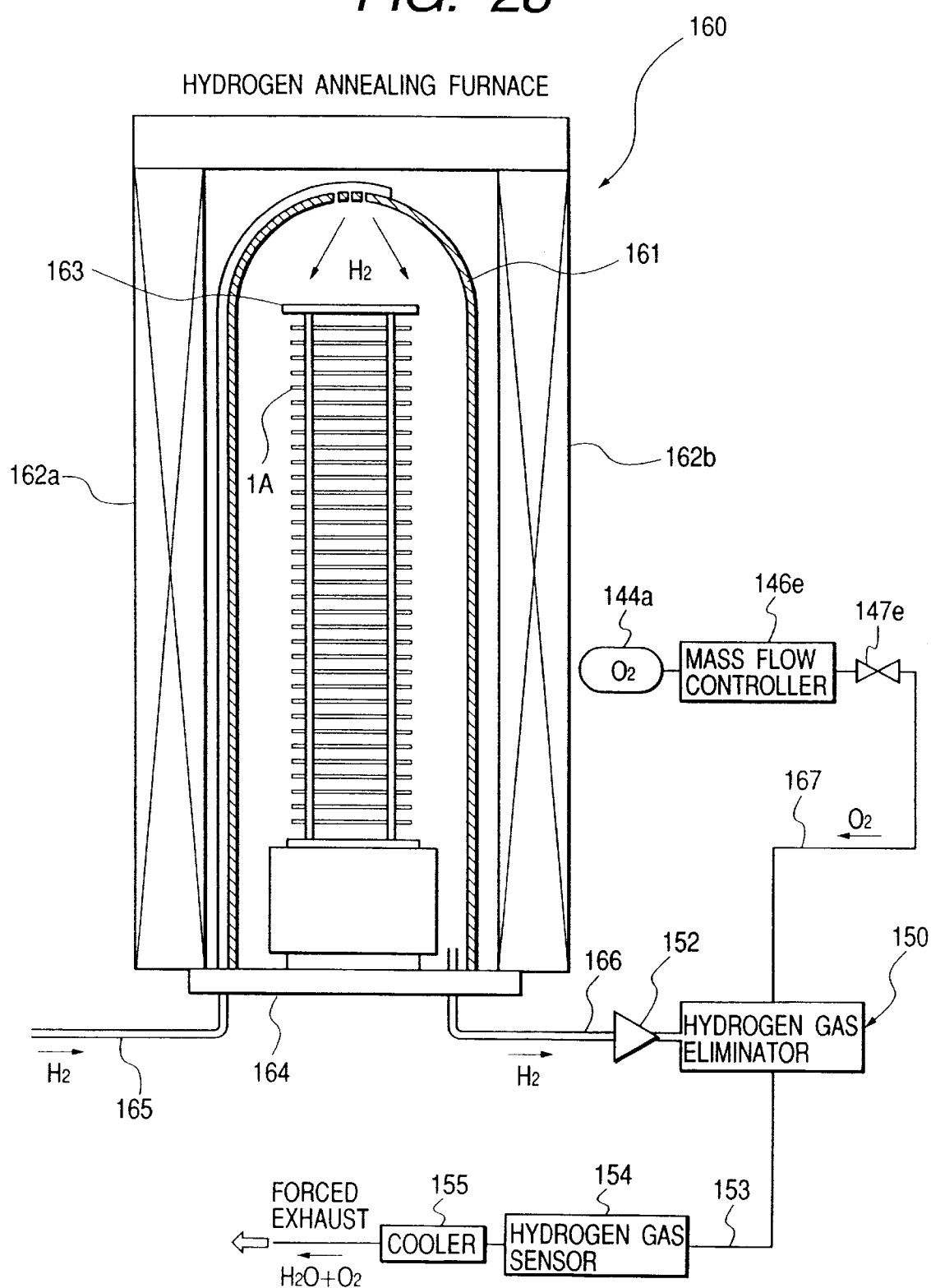
FIG. 28 is a schematic diagram showing a batch type vertical hydrogen annealing furnace and a catalytic type hydrogen gas eliminator connected to the furnace.
Figure 29:
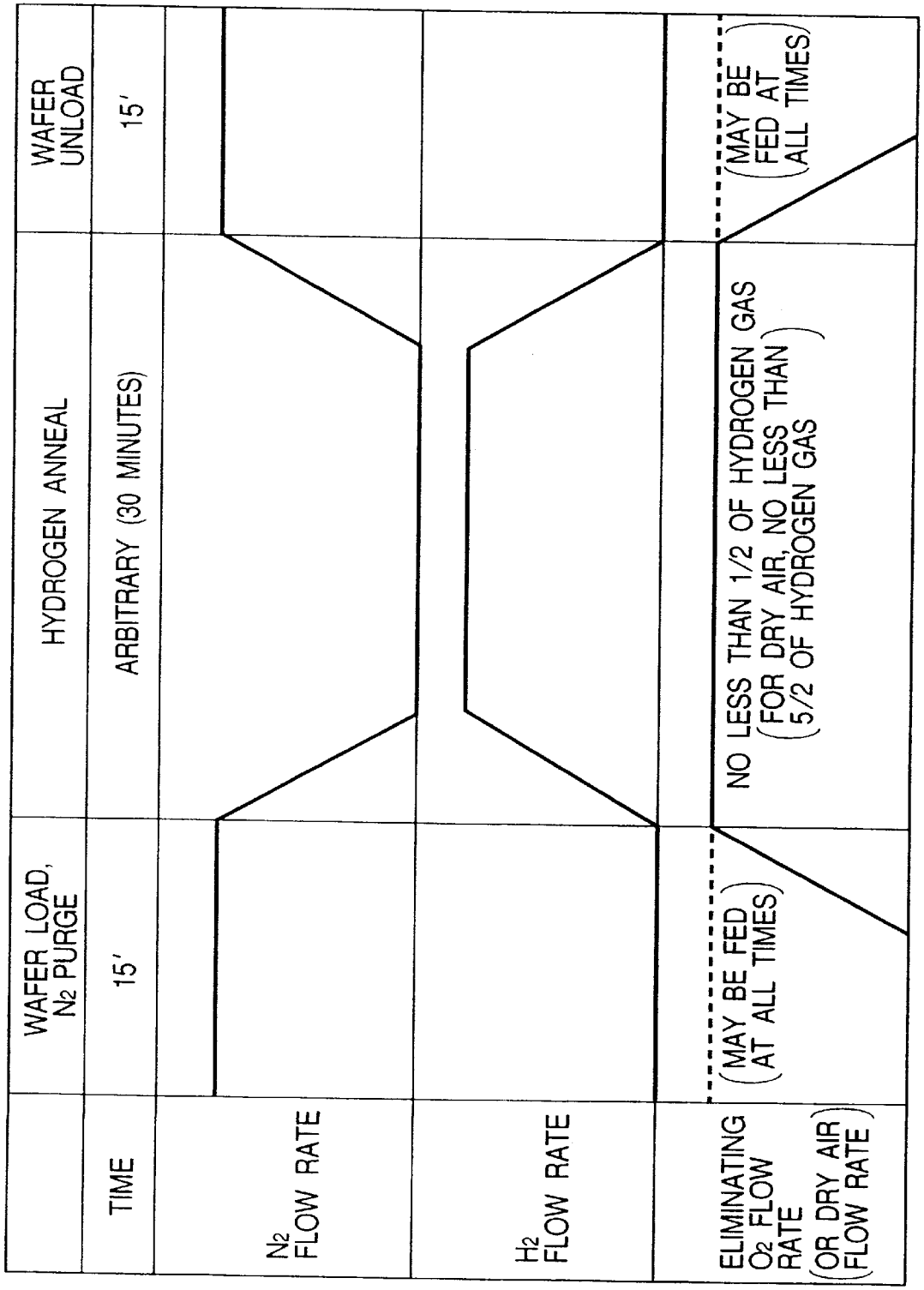
FIG. 29 is a diagram showing a sequence of a hydrogen annealing process using the batch type vertical hydrogen annealing furnace.

A DRAM manufacturing process for this embodiment will be described with reference to FIGS. 2 to 29. FIGS. 2 to 8 and FIGS. 14 to 27 are sections showing the individual portions of the memory array (MARY) and a peripheral circuit (e.g., the sense amplifier SA); FIGS. 9 and 10 are schematic diagrams showing the single wafer type oxidizing furnaces to be used for the light oxidations; FIG. 11 is a schematic diagram showing the catalytic type steam/hydrogen mixed gas generator and the hydrogen gas eliminator which are connected to the chamber of the oxidizing furnace; FIG. 12 is a graph illustrating temperature dependencies of an equilibrium vapor pressure ratio of oxidizing/reducing reactions using steam/hydrogen mixed gases; FIG. 13 is a diagram showing a sequence of the light oxidation process; FIG. 28 is a schematic diagram showing the batch type vertical hydrogen annealing furnace and the catalytic type hydrogen gas eliminator connected to the furnace; and FIG. 29 is a diagram showing a sequence of a hydrogen annealing process. In the following description, a numerical value, such as the thickness of a thin film, is merely illustrative and is not a limitation on the invention.

Figure 2:
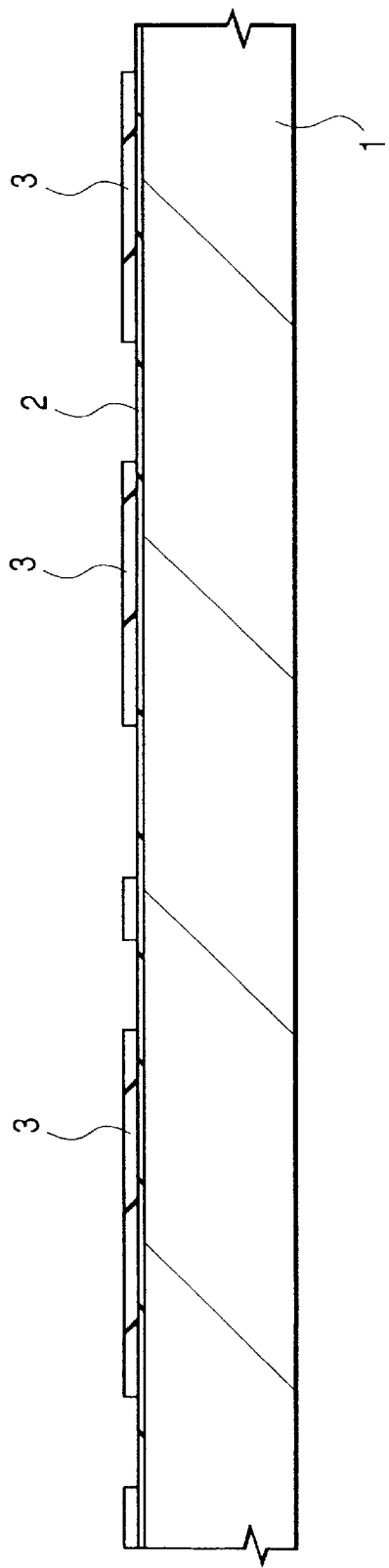
FIG. 2 is a section of an essential portion of a semiconductor substrate and shows a step in a DRAM manufacturing process according to one embodiment of the invention.

First of all, as shown in FIG. 2, a semiconductor substrate 1, made of single crystalline silicon having a specific resistance of about 10 Ωcm, is heat treated to form a silicon oxide film 2 (or pad oxide film) as thin as about 10 nm over its principal face. Next, a silicon nitride film 3 having a thickness of about 100 nm is deposited over the silicon oxide film 2 by the CVD (Chemical vapor Deposition) method and is then etched off from element isolating regions by using a photoresist film as a mask. The silicon oxide film 2 is formed to relieve the stress which is applied to the substrate when the silicon oxide film to be buried at a later step in element isolating grooves is sintered (or baked). The silicon nitride film 3 is hard to oxidize so that it is utilized as a mask for preventing the surface of its underlying (active) substrate from being oxidized.

Figure 3:
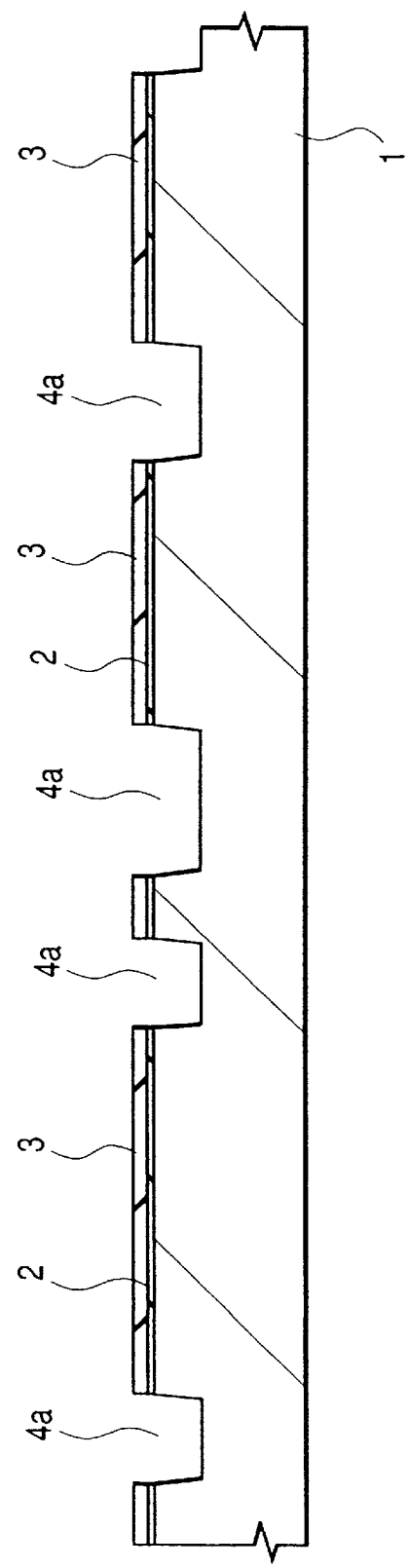
FIG. 3 is a section of the essential portion of the semiconductor substrate and shows a step in the DRAM manufacturing process according to the invention.

As shown in FIG. 3, the silicon nitride film 3 is used as a mask to dry-etch the silicon oxide film 2 and the semiconductor substrate 1 to form grooves 4a having a depth of about 300 to 400 nm in the semiconductor substrate 1 at the element isolating regions.

In order to remove the damaged layer formed in the inner walls of the grooves 4a by the etching, as shown in FIG. 4, the semiconductor substrate 1 is then heat treated to form a silicon oxide film 5 having a thickness of about 10 nm on the inner walls of the grooves 4a. After this, a silicon oxide film 6 is deposited over the semiconductor substrate 1 by the CVD method. In order to improve the quality of the silicon oxide film 6, the semiconductor substrate 1 is then heat treated to density (or bake) the silicon oxide film 6. After this, the silicon oxide film 6 is polished by a chemical mechanical polishing (CMP) method using the silicon nitride film 3 as the stopper and is left in the grooves 4a to form element isolating grooves 4.

Next, the silicon nitride film 3 is removed from over the semiconductor substrate 1 by the wet-etching method using hot phosphoric acid. After this, as shown in FIG. 5, a region (or memory array) to form the memory cell of the semiconductor substrate 1 and a region to form one portion of a peripheral circuit (or n-channel MISFET Qn) are doped with ions of B (boron) to form a p-type well 7, and a region to form the other portion (or p-type channel MISFET Qp) is doped with ions of P (phosphor) to form an n-type well 8.

Next, as shown in FIG. 6, the silicon oxide film 2 over the individual surfaces of the p-type well 7 and the n-type well 8 are removed with a rinsing liquid of HR. (hydrofluoric acid). After this, the semiconductor substrate 1 is wet-oxidized to form a clean gate oxide film 9 having a thickness of about 5 nm over the individual surfaces of the p-type well 7 and the n-type well 8.

After the gate oxide film 9 was formed, although the invention is not especially limited thereto, an oxidation/nitriding to segregate nitrogen in the interface between the gate oxide film 9 and the semiconductor substrate 1 may be performed by heat treating the semiconductor substrate 1 in the atmosphere of NO (nitric oxide) or $N_2O$ (nitrous oxide). When the gate oxide film 9 becomes as thin as about 5 nm, a strain occurring in the interface between the gate oxide film 9 and the semiconductor substrate 1 is actualized by the difference between their coefficients of thermal expansion to induce generation of hot carriers. This strain is relieved by the nitrogen segregated in the interface with the semiconductor substrate 1, so that the aforementioned oxidation/nitriding can improve the reliability of the extremely thin gate oxide film 9.

Next, as shown in FIG. 7, gate electrodes 14A (or word lines WL) and gate electrodes 14B and 14C having a gate length of 0.24 microns are formed over the gate oxide film 9. These gate electrodes 14A (or word lines WL) and gate electrodes 14B and 14C are formed by depositing a polycrystalline silicon film 10, as doped-with an n-type impurity, such as P (phosphor), to have a thickness of about 70 nm, over the semiconductor substrate 1, by the CVD method, and by depositing a WN film 11 having a thickness of about 30 nm and a W film 12 having a thickness of about 100 nm over the polycrystalline silicon film 10 by the sputtering method, by depositing a silicon nitride film 13 having a thickness of about 150 nm over the films 11 and 12 by the CVD method, and by patterning those films by using a photoresist as a mask.

When the gate electrodes 14A (or word lines WL) are partially made of a metal (W) having a low resistance, their sheet resistance can be lowered to about 2 Ω/□ to reduce the word line delay. Since this word line delay can be reduced even if the gate electrodes 14 (or word lines) are backed up with Al wiring, moreover, the number of the wiring layers to be formed over the memory cells can be reduced by one.

Figure 8:
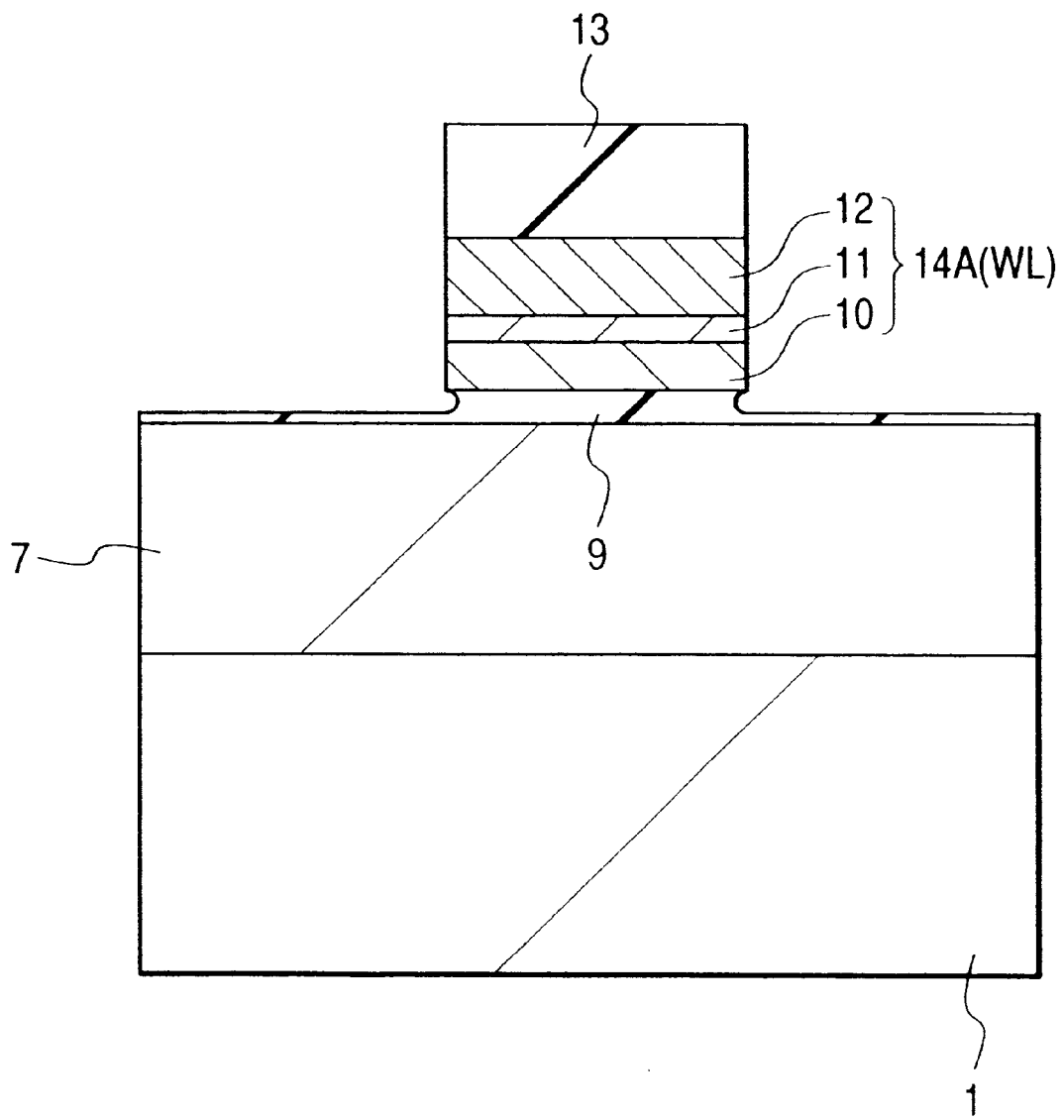
FIG. 8 is a section of the essential portion of the semiconductor substrate and shows a step in the DRAM manufacturing process according to the invention.

After this, the photoresist is ashed off, and the semiconductor substrate 1 is cleared of the dry-etching residue and the ashing residue from its surface by using an etching liquid such as hydrofluoric acid. By this wet-etching, as shown in FIG. 8, the gate oxide film 9 in the regions other than those below the gate electrodes 14A (or word lines) (and the not-shown gate electrodes 14B and 14C) are etched off, and the gate electrodes 14 below the gate side walls is also isotropically etched off to establish an under-cut. Then, there arises a disadvantage that the withstand voltage of the gate oxide film 9 drops. In order to reproduce the removed gate oxide film 9, therefore, a re-oxidation (or light oxidation) is performed by the following method.

Figure 9A:
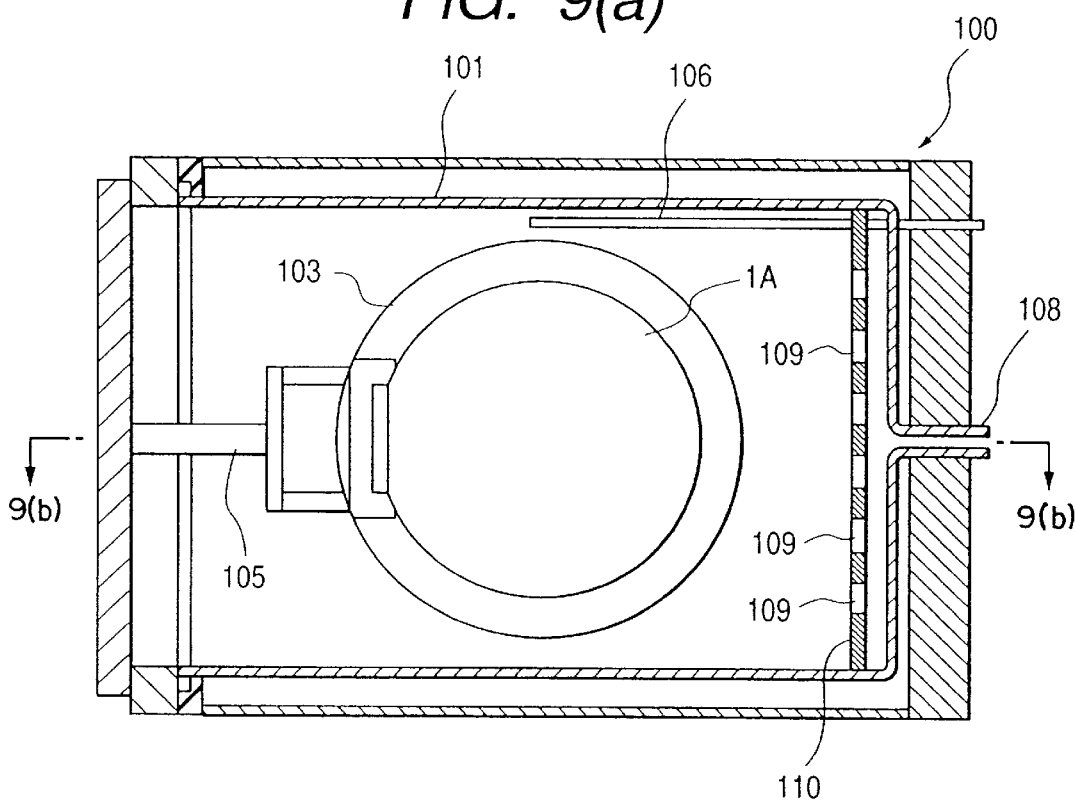
FIG. 9(a) is a schematic top plan view showing a single wafer type oxidizing furnace to be used for light oxidations.
Figure 9B:
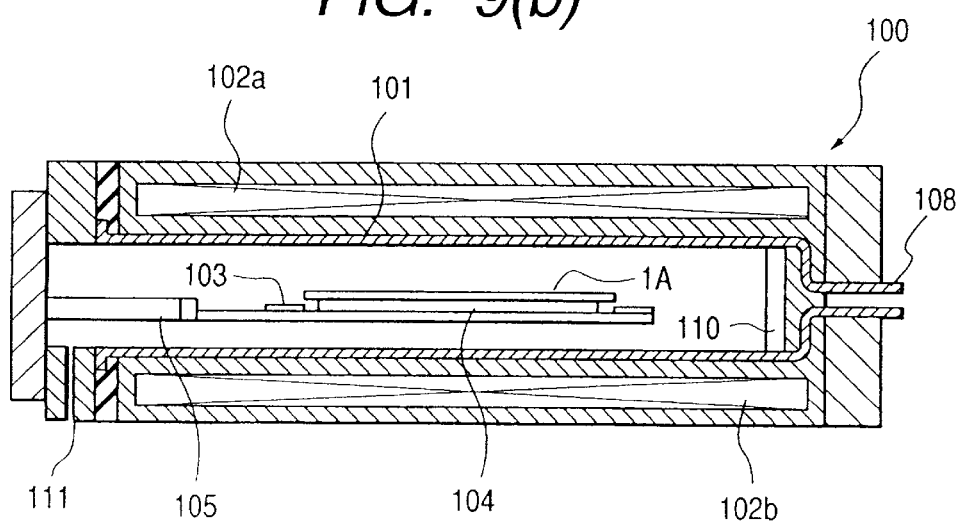
FIG. 9(b) is a section taken along line B–B' of FIG. 9(a)
Figure 10A:
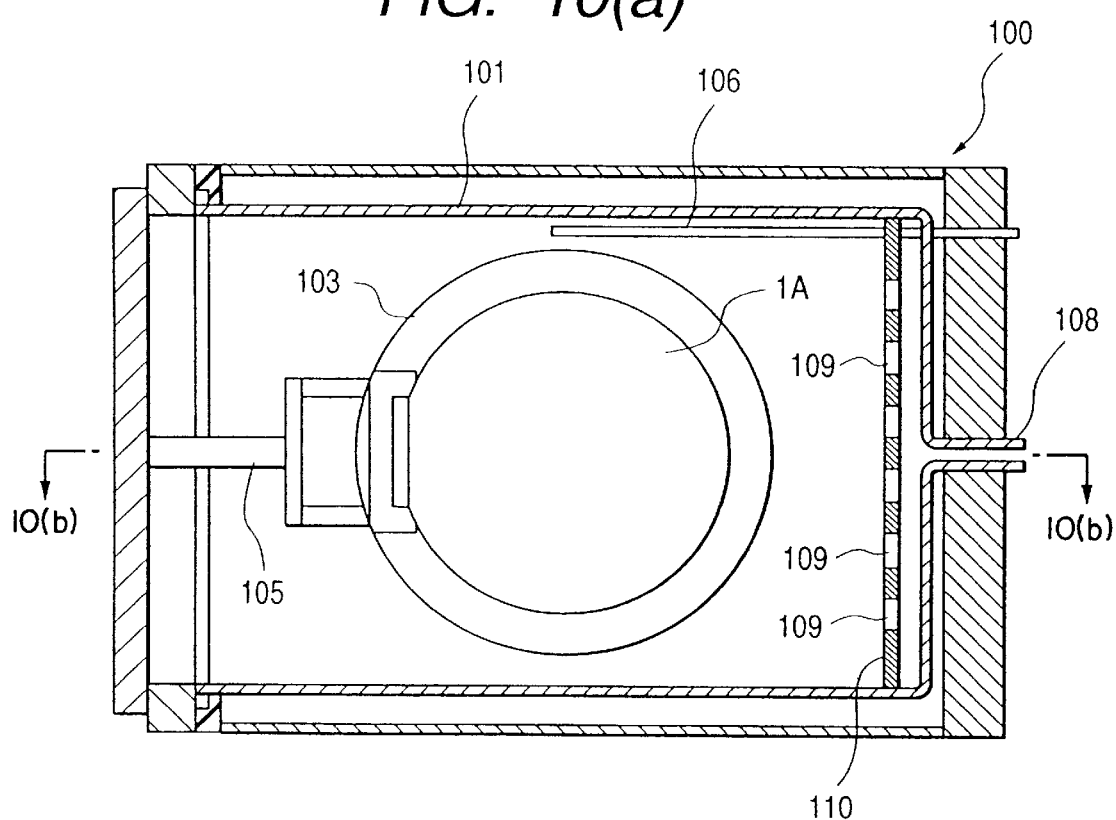
FIG. 10(a) is a schematic top plan view showing a single wafer type oxidizing furnace to be used for light oxidations.
Figure 10B:
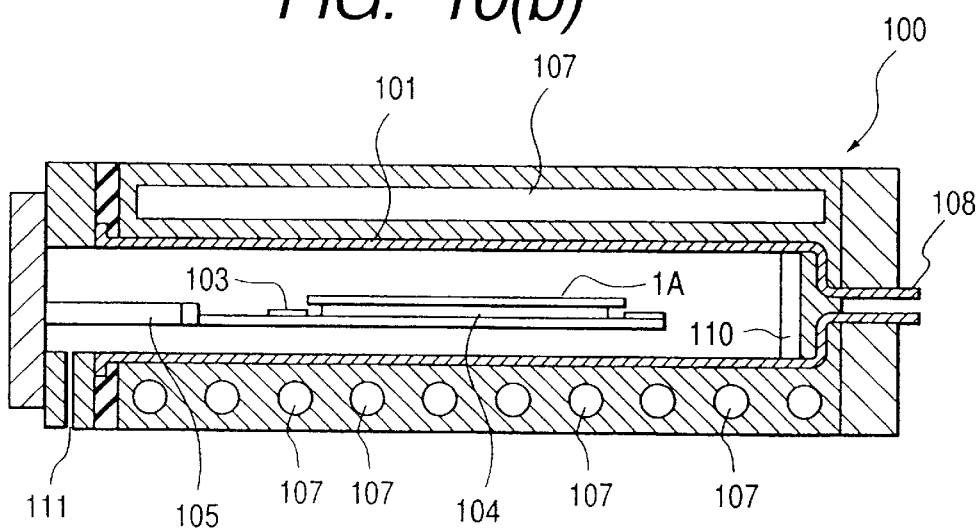
FIG. 10(b) is a section taken along line B–B' of FIG. 10(a)

FIG. 9(a) is a schematic top plan view showing one example of the specific construction of a single wafer type oxidizing furnace to be used for light oxidations, and FIG. 9(b) is a section taken along line B–B' of FIG. 9(a).

This single wafer type oxidizing furnace 100 is equipped with a chamber 101 made of a multi-walled quartz tube, over and under which there are placed heaters 102a and 102b for heating a semiconductor wafer 1A. In the chamber 101, there is disposed a disc-shaped soaking ring 103 for dispersing the heat from those heaters 102a and 102b homogeneously all over the surface of the semiconductor wafer 1A. The soaking ring 103 is overlain by a susceptor 104 for holding the semiconductor wafer 1A in a horizontal position. The soaking ring 103 is made of a heat-resisting material such as quartz or Sic (silicon carbide) and is supported by a support arm 105 extending from the wall face of the chamber 101. In the vicinity of the soaking ring 103, there is placed a thermocouple 106 for measuring the temperature of the semiconductor wafer 1A held by the susceptor 104 The semiconductor wafer 1A may be heated not only by the heaters 102a and 102b but also by a lamp 107, for example, as shown in FIG. 10.

To a portion of the wall face of the chamber 101, there is connected one end of a gas inlet pipe 108 for introducing the steam/hydrogen mixed gas and a purge gas into the chamber 101. To the other end of the gas inlet pipe 108, there is connected a catalytic type gas generator, as will be described. In the vicinity of the gas inlet pipe 108, there is disposed a partition 110 having a number of through holes 109 so that the gas, as introduced into the chamber 101, is uniformly distributed in the chamber 101 through the through holes 109 of the partition 110. To another portion of the wall face of the chamber 101, there is connected one end of an exhaust pipe 111 for discharging the gas introduced into the chamber 101. To the other end of the exhaust pipe 111, there is connected a catalytic type gas eliminator, as will be described.

FIG. 11 is a schematic diagram showing the catalytic type steam/hydrogen mixed gas generator 140 and a hydrogen gas eliminator 150 which are connected to the single wafer type oxidizing furnace 100.

The steam/hydrogen mixed gas generator 140 is equipped with a reactor 141a made of a heat/corrosion-resisting alloy (e.g., the Ni alloy known under the trade name "Hastelloy"). In the reactor 141a, there are housed a coil 142 made of a catalytic metal such as Pt (platinum), Ni (nickel) or Pd (palladium) and a heater 143 for heating the coil 142.

Into the reactor 141a of the gas generator 140, there are introduced the hydrogen gas, the oxygen gas and the purge gas in the form of an inert gas of nitrogen or Ar (argon) from individual gas reservoirs 144a, 144b and 144c via a pipe 145. Between these gas reservoirs 144a, 144b and 144c and the pipe 145, there are interposed mass flow controllers 146a, 146b and 146c for regulating the gas flows and control valves 147a, 147b and 147c for opening/closing the passages for the gases, so that the flows and ratios of gases to be introduced into the reactor 141a are precisely controlled.

The hydrogen gas and the oxygen gas, as introduced into the reactor 141a, come into contact with the coil 142 which has been heated to about 350 to 450° C. (for which it is well known that the lowest temperature for the oxygen/hydrogen mixed gas to burn explosively is generally at about 550° C. under the atmospheric pressure) so that they are excited to generate hydrogen radicals ($H_2 \rightarrow 2H^+$) from the hydrogen molecules and oxygen radicals ($O_2 \rightarrow 2O^+$) from the oxygen molecules. These two kinds of radicals are so chemically active that they instantly react to generate water (or steam) ($2H^+ + O^+ H_2O$). By introducing into the reactor 141a the hydrogen/oxygen mixed gas containing more hydrogen than the mole ratio (hydrogen:oxygen=2:1) to generate water, therefore, it is possible to generate the steam/hydrogen mixed gas. The steam/hydrogen mixed gas thus generated is introduced via the gas inlet pipe 108 into the chamber 101 of the oxidizing furnace 100.

Since the catalytic type gas generator 140 can control the quantities and ratio of the hydrogen and oxygen involved in the water generation in a highly precise manner, the steam concentration in the steam/hydrogen mixed gas to be introduced into the chamber 101 can be highly precisely controlled over a wide range from an extremely low value on the order of ppm to a high value of several tens %. Moreover, the water is generated instantly as the process gas is introduced into the reactor 141a so that the steam/hydrogen mixed gas of a desired steam concentration can be generated in real time. As a result, the immigration of a foreign substance can be minimized to introduce a clean steam/hydrogen mixed gas into the chamber 101. Here, the catalytic metal in the reactor 141a should not be limited to the above-specified one, but can be other materials which can radicalize hydrogen and oxygen. Moreover, the catalytic metal can be used not only by coiling it, but also by working it into hollow tubes or a fine fiber filter to pass the process gas therethrough.

FIG. 12 is a graph illustrating the temperature dependencies of an equilibrium vapor pressure ratio ($P(H_2O)/P(H_2)$) of oxidizing/reducing reactions using steam/hydrogen mixed gases. Curves (a) to (e) appearing in FIG. 12 illustrate the equilibrium vapor pressures of W, Mo, Ta (tantalum), Si and Ti, respectively.

By setting the steam/hydrogen partial pressure ratio of the steam/hydrogen mixed gas to be introduced into the chamber 101 of the oxidizing furnace 100 in the range of the region defined by the curves (a) and (d), as illustrated in FIG. 12, only Si can be selectively oxidized without oxidizing the W film 12 forming portions of the gate electrodes 14A (or word lines WL) and the gate electrodes 14B and 14C and the WN film 11 or the barrier layer. As illustrated, the oxidation rate of any of the metals (W, Mo, Ta or Ti) and Si lowers as the steam concentration in the steam/hydrogen mixed gas lowers. By lowering the steam concentration in the steam/ hydrogen mixed gas, therefore, it is easy to control the oxidation rate and the oxidized film thickness of Si.

Likewise, when the gate electrodes are partially made of a Mo film, only Si can be selectively oxidized without any oxidation of the Mo film by setting the steam/hydrogen partial pressure within the range of the region defined by the curves (b) and (d). When the gate electrodes are partially made of a Ta film, on the other hand, only the Si can be selectively oxidized without any oxidation of the Ta film by setting the steam/hydrogen partial pressure ratio within the range of a region defined by the curves (c) and (d).

Since Ti has a higher oxidation rate than that of Si in the atmosphere of the steam/hydrogen mixed gas, as shown, only Si cannot be selectively oxidized without any oxidation of the Ti film or the TiN film when the gate electrodes are partially made of the Ti film or when the barrier layer is made of the TiN film. In this case, however, the oxidation rates and the oxide film thicknesses of the Ti film, the TiN film and the Si can be easily controlled by setting the steam in the steam/hydrogen mixed gas to an extremely low concentration, so that the oxidation of the Ti film or the TiN film can be minimized to suppress the characteristic deterioration of the gate electrodes within a range wherein there is no practical problem. Specifically, the upper limit of the steam concentration is desired to be lower than about 1 Since some quantity of steam is required for improving the profile of the end portions of the side walls of the gate electrodes, moreover, the lower limit is desired to be at about 10 ppm to 100 ppm.

The steam/hydrogen mixed gas, as introduced into the chamber 101 of the oxidizing furnace 100, is introduced via the exhaust pipe 111 into a reactor 141b of the hydrogen gas eliminator 150, as shown in FIG. 11, after the end of the light oxidation of the semiconductor wafer 1A. At this time, the oxygen gas is fed via a pipe 151 from the gas reservoir 144a to the inside of the exhaust pipe 111 so that it is introduced together with the steam/hydrogen mixed gas into the reactor 141b. Between the gas reservoir 144a and the pipe 151, there are interposed a mass flow controller 146d for regulating the flow of the oxygen gas and a control valve 147d for opening/closing the passage of the oxygen gas, so that the flow of the oxygen gas to be introduced into the reactor 141b is precisely controlled by the controller and the valve. Midway of the exhaust pipe 111, moreover, there is disposed a check valve 152 for preventing the back flow of the oxygen gas into the chamber 101 of the oxidizing furnace 100.

The reactor 141b of the hydrogen gas eliminator 150 is made, like the reactor 141a of the aforementioned gas generator 140, of a heat-/corrosion-resisting alloy. In the reactor 141b, there are housed the coil 142 made of a catalytic metal, such as Pt, Ni or Pd, and the heater 143 for heating the coil 142. The hydrogen gas and the oxygen gas, as introduced into that reactor 141b, come into contact with the coil 142 which has been heated to about 350 to 450° C. (for which it is well known that the lowest temperature for the oxygen/hydrogen mixed gas to burn explosively is generally at about 550° C. under atmospheric pressure) so that they are excited. As a result, the hydrogen radicals generated from the hydrogen molecules and the oxygen radicals generated from the oxygen molecules instantly react to generate water (or steam).

When the steam/hydrogen mixed gas, as discharged from the oxidizing furnace 100, is to be introduced into the reactor 141b, therefore, a simultaneous introduction is made of oxygen of at least one half (at mole ratio) of the hydrogen in the mixed gas. As a result, the hydrogen gas can be completely oxidized into water. This oxygen gas may be either introduced into the reactor 141b prior to the introduction of the steam/hydrogen mixed gas or continuously fed to the inside of the reactor 141b at all times via the pipe 151 and the exhaust pipe 111. The water (or steam) thus generated in the reactor 141b is discharged together with the excessive oxygen gas to the outside via an exhaust pipe 153. Midway of this exhaust pipe 153, there are disposed a hydrogen gas sensor 154 for confirming whether or not the hydrogen gas has been completely converted into water and a cooler 155 for liquefying the hot steam discharged.

One example of a sequence of the light oxidation process using the oxidizing furnace 100 will be described with reference to FIG. 13.

First of all, the chamber 101 of the oxidizing furnace 100 is opened, and the susceptor 104 is loaded thereon with the semiconductor wafer 1A while the purge gas (nitrogen) is being introduced into the inside of the chamber 101. After this, the chamber 101 is closed, and the purge gas is continuously introduced to interchange the gas in the chamber 101 sufficiently. The susceptor 104 is heated in advance with the heaters 102a and 102b so that the semiconductor wafer 1A may be quickly heated. The heating temperature of the semiconductor wafer 1A is set within a range of 800 to 900° C., such as 850° C. At a wafer temperature of 800° C. or less, the silicon oxide film has a deteriorated quality. At a temperature of 900° C. or more, on the other hand, the wafer is liable to have a roughed surface.

Next, hydrogen is introduced into the chamber 101 to discharge the nitrogen. This nitrogen desirably should be completely discharged, because an undesired nitriding may occur if the nitrogen is left in the chamber 101.

Next, oxygen and excess hydrogen are introduced into the reactor 141 of the gas generator 140, and the water, as generated from the oxygen and the hydrogen by the catalytic action, is introduced together with the excess hydrogen into the chamber 101 to oxidize the surface of the semiconductor wafer 1A for a predetermined time period. As a result, the gate oxide film 9, as wet-etched and thinned, is oxidized again to improve the profiles of the end portions of the side walls of the undercut gate electrodes 14A (or word lines WL) and the gate electrodes 14B and 14C.

If the aforementioned light oxidation is performed for a long time, the thickness of the oxide film in the vicinity of the end portions of the gate electrodes increases more than necessary to cause offsets in the end portions of the gate electrodes and to shift the threshold voltage (Vth) of the MOSFETs from a design value. There arises another problem that the effective channel length becomes shorter than the worked value of the gate electrodes. Especially, the miniature MOSFETs having a gate length of around 0.25 microns are strictly restricted from the aspect of the element design in the allowance of the gate working size for becoming thin from the designed value. This is because the threshold voltage is abruptly lowered by the short channel effect even when the thinning quantity slightly increases. In the case of gate electrodes having a gate length of around 0.25 microns, a level, at which the end portions of the sidewalls of the polycrystalline silicon film forming the portions of the gate electrodes are lightly oxidized by about 0.1 microns (or about 0.2 microns for the two ends), is thought to be a limit for not causing abrupt reduction in the threshold voltage. Hence, the oxide film thickness to be grown by the light oxidation is desired to be limited to not more than 1.5 times the gate oxide film thickness.

Next, the purge gas (or nitrogen) is introduced into the chamber 101 to discharge the unnecessary steam/hydrogen mixed gas to the outside via the exhaust pipe 111. After this, the chamber 101 is opened to unload the semiconductor wafer 1A from the susceptor 104 while being fed with the purge gas. On the other hand, the steam/hydrogen mixed gas, as discharged from the chamber 101, is fed together with the oxygen gas, as fed via the pipe 151, to the reactor 141b of the hydrogen gas eliminator 150 so that the hydrogen gas in the mixed gas and the oxygen gas are converted into water (or steam) by catalytic action. The steam is forcibly discharged together with the excess oxygen gas to the outside via the exhaust pipe 153 so that it is liquefied by the cooler 155. After this, the oxygen is discharged to the outside via the exhaust duct, and the water is discharged via the drain.

Here, the hydrogen gas can be oxidized with dry air in place of the hydrogen gas. Considering the content (about 21%) of oxygen in the air, the dry air containing oxygen of at least one half (in mole ratio) of the content of hydrogen in the steam/hydrogen mixed gas is introduced into the reactor 141b so that the hydrogen gas can be completely converted into water.

Figure 14:
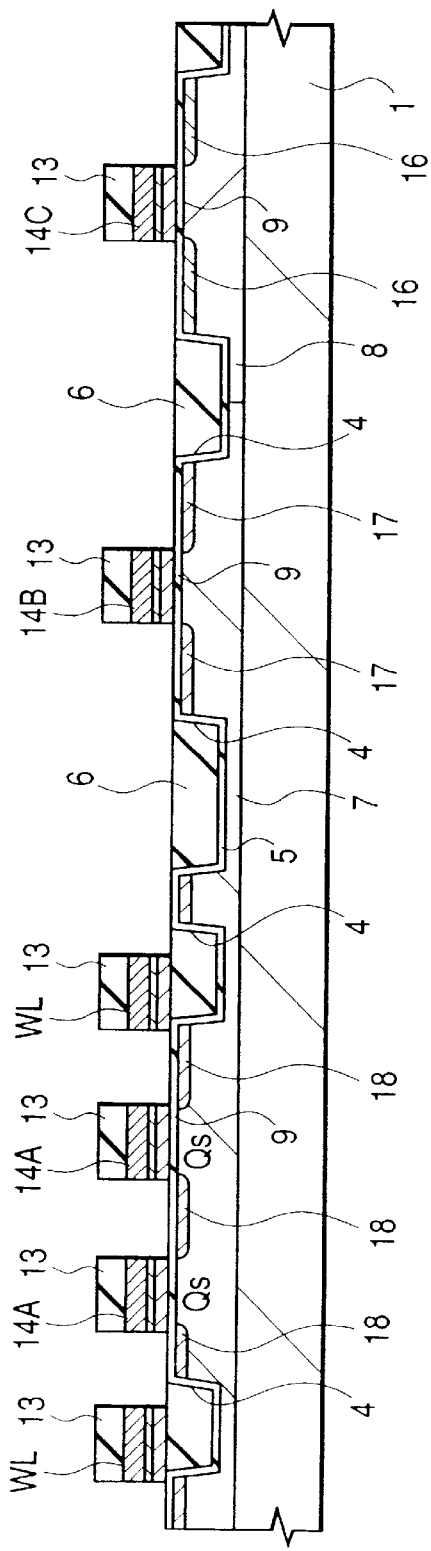
FIG. 14 is a section of the essential portion of the semiconductor substrate and shows a step in the DRAM manufacturing process according to an embodiment of the invention.

Here will be described the DRAM process after the light oxidation step thus far described. First of all, the n-type well 8 is doped with the ions of a p-type impurity such as B (boron), as shown in FIG. 14, to form a p$^-$-type semiconductor region 16 in the n-type wells 8 at the two sides of the gate electrode 14C. Moreover, the p-type well 7 is doped with the ions of an n-type impurity such as P (phosphor) to form n$^-$-type semiconductor regions 17 in the p-type wells 7 at the two sides of the gate electrode 14B and n-type semiconductor regions 18 in the p-type well 7 at the two sides of the gate electrodes 14A.

Figure 15:
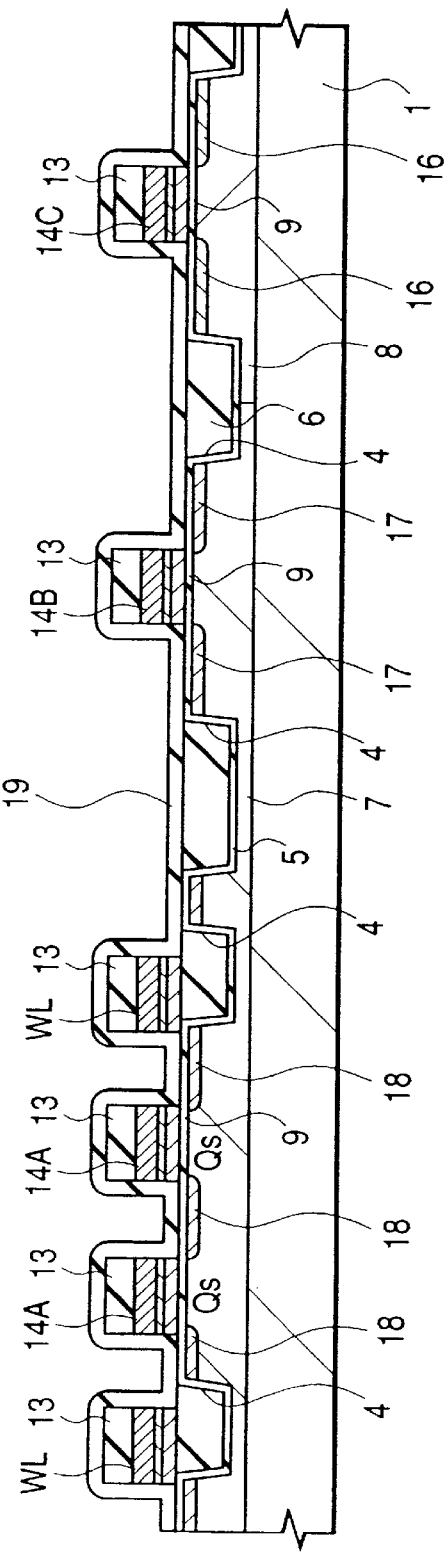
FIG. 15 is a section of the essential portion of the semiconductor substrate and shows a step in the DRAM manufacturing process according to the invention.
Figure 16:
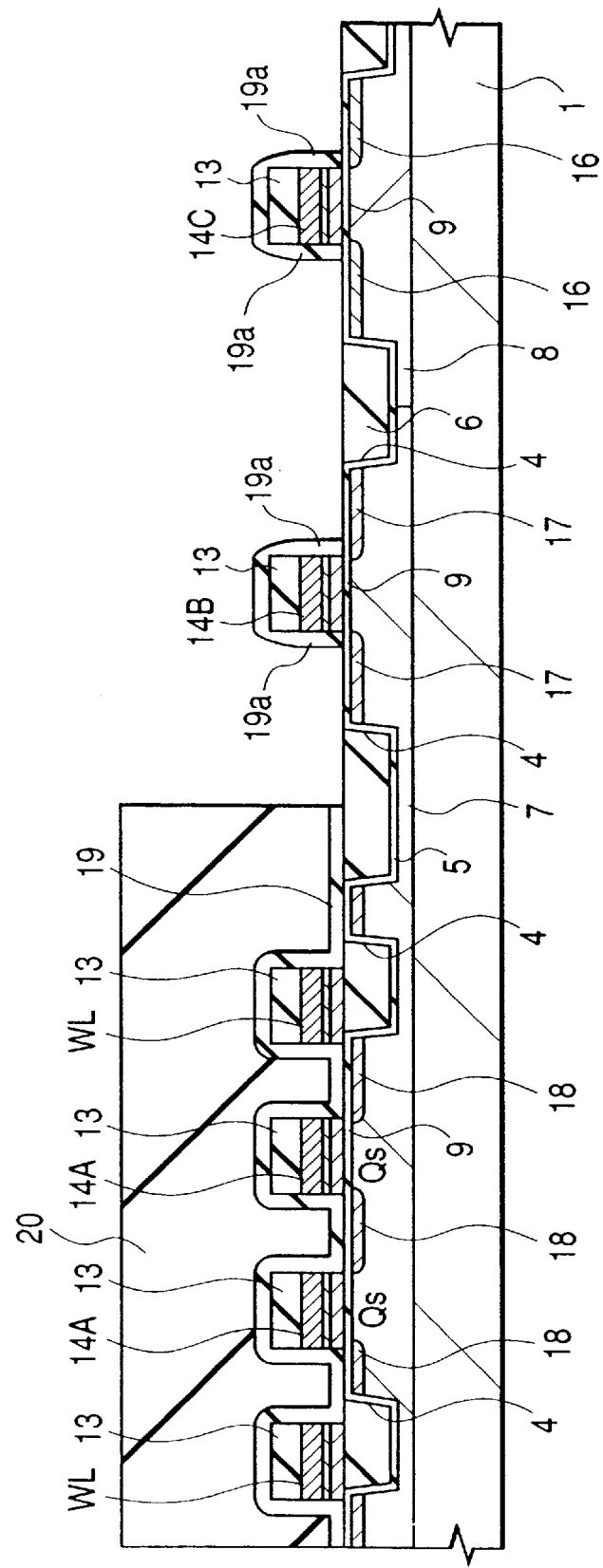
FIG. 16 is a section of the essential portion of the semiconductor substrate and shows a step in the DRAM manufacturing process according to the invention.

Next, a silicon nitride film 19 is deposited over the semiconductor substrate 1 by the CVD method, as shown in FIG. 15. After this, the memory array is covered with a photoresist film 20, as shown in FIG. 16, and the silicon nitride film 19 of the peripheral circuit is anisotropically etched to form side wall spacers 19a at the side walls of the gate electrodes 14B and 14C. This etching employs an etching gas to limit the over-etching amount to the necessary minimum and to take a large selection ratio to the silicon oxide film 6 so as to minimize the removal of the silicon oxide film 6 buried in the element isolating grooves 4 and the silicon nitride film 19 on the gate electrodes 14B and 14C.

Figure 17:
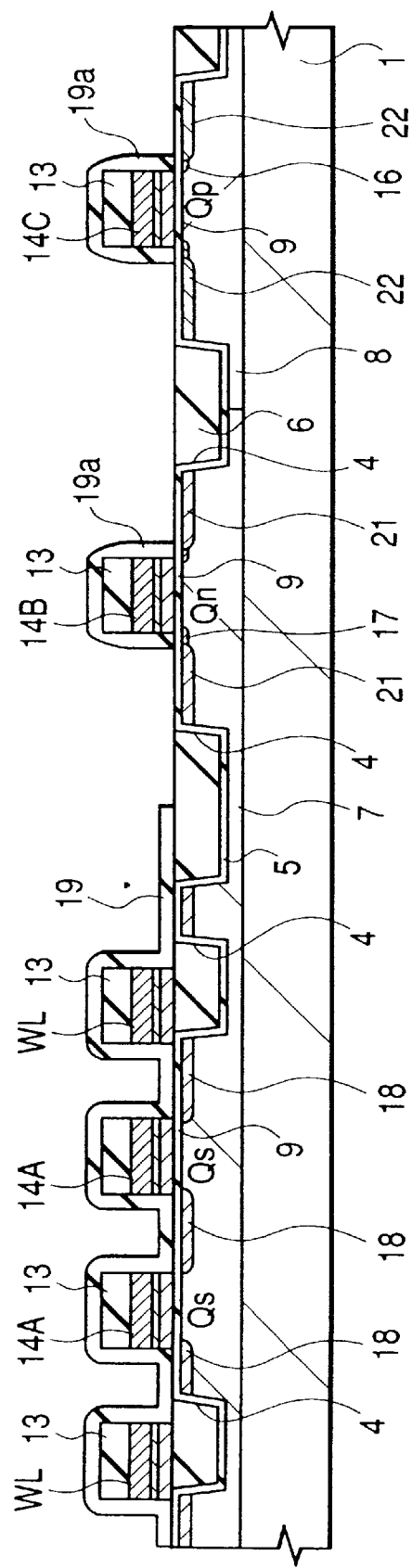
FIG. 17 is a section of the essential portion of the semiconductor substrate and shows a step in the DRAM manufacturing process according to the invention.

Next, as shown in FIG. 17, the p-type well 7 of the peripheral circuit is doped with the ions of an n-type impurity such as As (arsenic) to form an n$^+$-type semiconductor region 21 (or source and drain) of the n-channel MISFET Qn, and the n-type well 2 is doped with the ions of a p-type impurity such as B (boron) to form p$^+$-type semiconductor region 22 (or source and drain) of the p-channel MISFET Qp.

Figure 18:
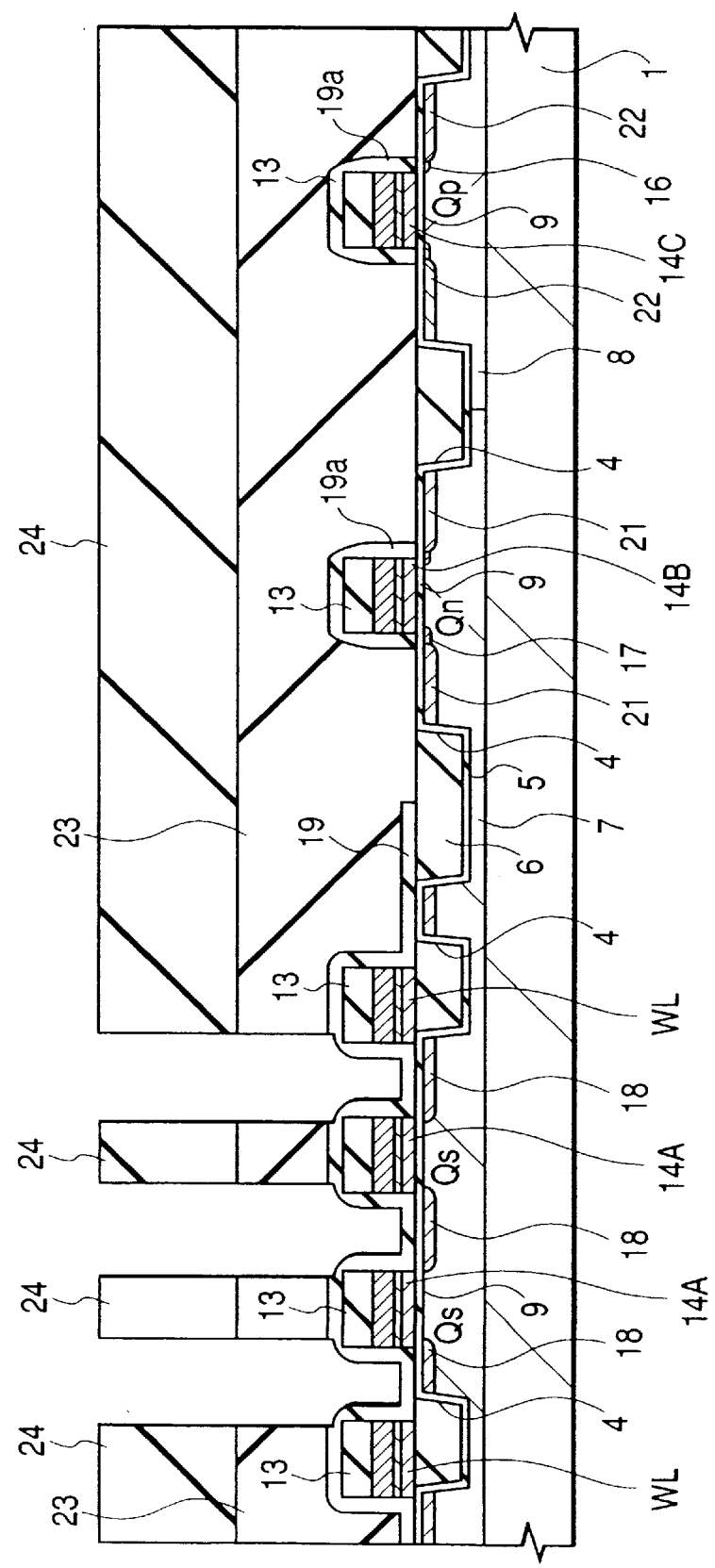
FIG. 18 is a section of the essential portion of the semiconductor substrate and shows a step in the DRAM manufacturing process according to the invention.

Next, a silicon oxide film 23 is deposited on the semiconductor substrate 1 by the CVD method, as shown in FIG. 18, and its surface is flattened by using a chemical mechanical polishing method. After this, the silicon oxide film 23 over the n-type semiconductor region 18 (or source and drain) of the memory cell selecting MISFET Qs is removed by dry etching using a photoresist film 24 as a mask. This etching is performed under a condition to raise the etching rate of the silicon oxide film 23 for the silicon nitride films 13 and 19 so that the silicon nitride film 19 over the n-type semiconductor region 18 may not be removed.

Figure 19:
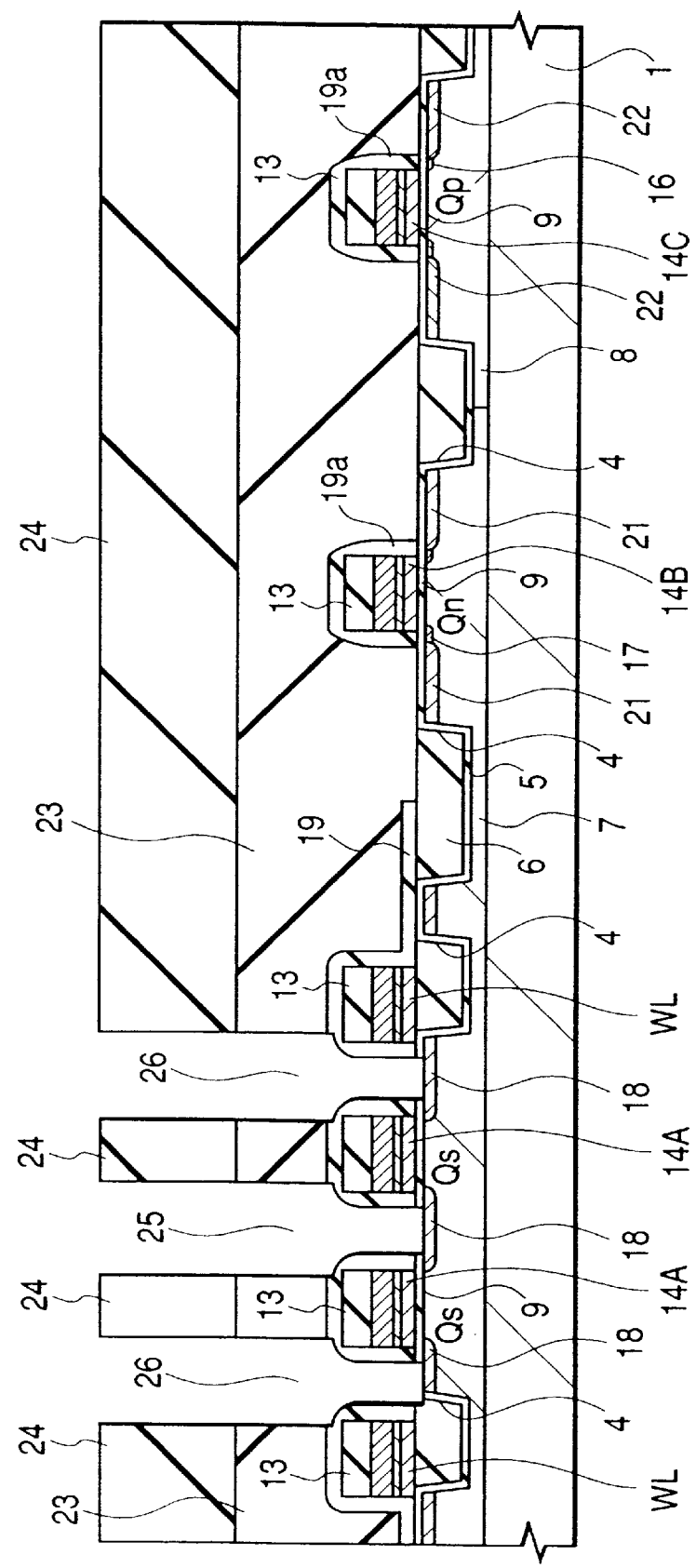
FIG. 19 is a section of the essential portion of the semiconductor substrate and shows a step in the DRAM manufacturing process according to the invention.

Next, the silicon nitride film 19 and the gate oxide film 9 over the n-type semiconductor region 18 (or source and drain) of the memory cell selecting MISFET Qs are removed by dry etching using the photoresist film 24 as a mask, as shown in FIG. 19, to form a contact hole 25 over one (or the n-type semiconductor region 18) of the source and drain and a contact hole 26 over the other (or the n-type semiconductor region 18). This etching employs an etching gas to reduce the over-etching amount to the necessary minimum and to increase a selection ratio for the semiconductor substrate 1 (of silicon) so as to minimize the removal of the semiconductor substrate 1. Moreover, this etching is performed under the condition to etch the silicon nitride film 19 anisotropically thereby to leave the silicon nitride film 19 at the side walls of the gate electrodes 14A (or the word lines WL). Thus, the contact holes 25 and 26 are formed in self-alignment with the gate electrodes 14A (or the word lines WL). In order to form the contact holes 25 and 26 in self-alignment with the gate electrodes 14A (or the word lines WL), the silicon nitride film 19 may be anisotropically etched in advance to form side wall spacers at the side walls of the gate electrodes 14A (or the word lines WL).

Figure 20:
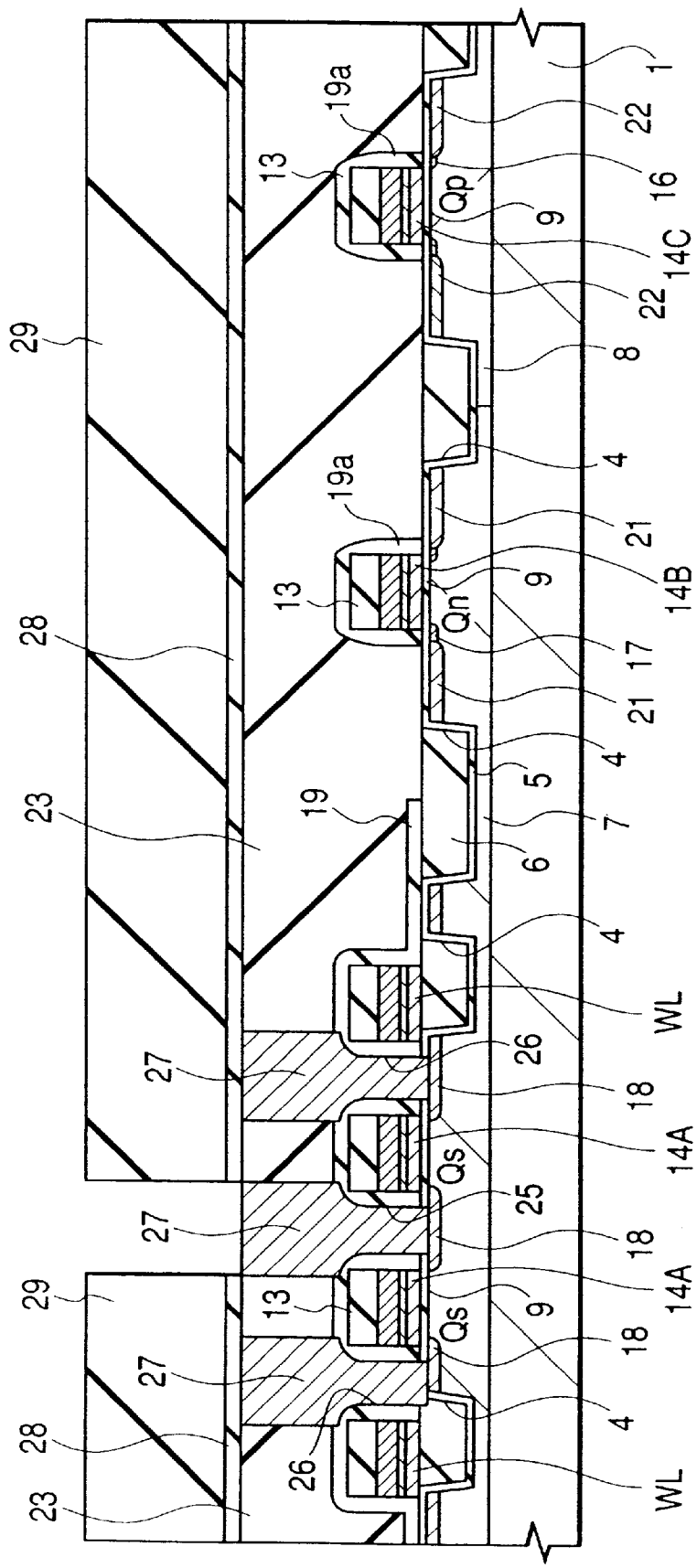
FIG. 20 is a section of the essential portion of the semiconductor substrate and shows a step in the DRAM manufacturing process according to the invention.

Next, plugs 27 are buried in the contact holes 25 and 26, as shown in FIG. 20. After this, a silicon oxide film 28 is deposited on the silicon oxide film 23 by the CVD method and is then removed from over the contact hole 25 by dry-etching using a photoresist film 29 as a mask. In order to bury the plugs 27 in the contact holes 25 and 26, a polycrystal silicon film, as doped with P (phosphor), is deposited on the silicon oxide film 23 by the CVD method and is then polished by a chemical mechanical polishing method so that it is removed from over the silicon oxide film 23. The P (phosphor) in the polycrystal silicon film is partially diffused from the bottom portions of the contact holes 25 and 26 into the n-type semiconductor region 18 (or source and drain) by a subsequent hot process to lower the resistance of the n-type semiconductor region 18.

Figure 21:
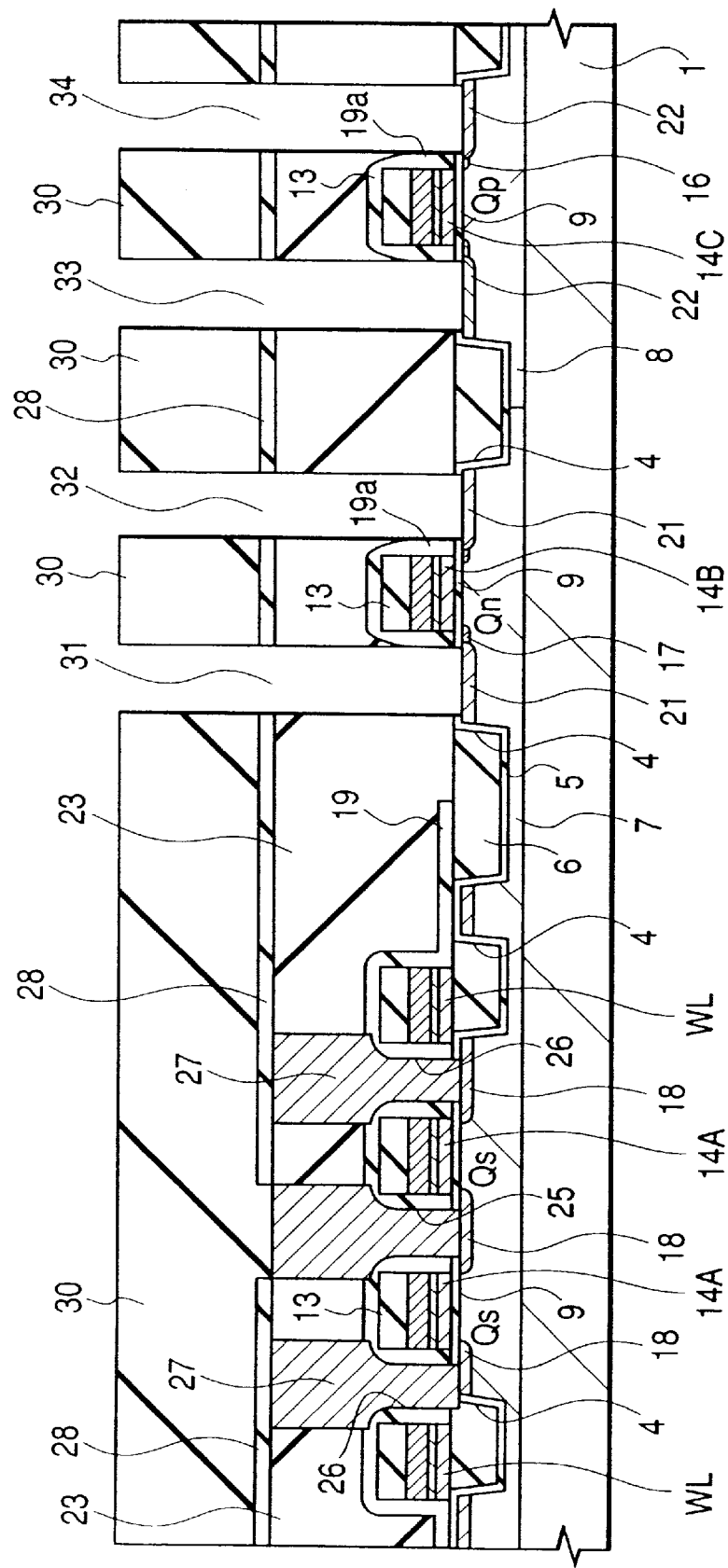
FIG. 21 is a section of the essential portion of the semiconductor substrate and shows a step in the DRAM manufacturing process according to the invention.

Next, the silicon oxide films 28 and 23 and the gate oxide film 9, in the form of the peripheral circuit, are removed by dry-etching using a photoresist film 30 as a mask, as shown in FIG. 21, to form contact holes 31 and 32 over the source and drain (or n$^+$-type semiconductor region 21) of the n-channel MISFET Qn and contact holes 33 and 34 over the source and drain (or p$^+$-type semiconductor region 22) of a p-channel MISFET Qp. This etching is performed under the condition to increase the etching rate of the silicon oxide film for the silicon nitride film 13 and the side wall spacers 19a thereby to form the contact holes 31 and 32 in self-alignment with the gate electrode 14B and the contact holes 33 and 34 in self-alignment with the gate electrode 14C.

Figure 22:
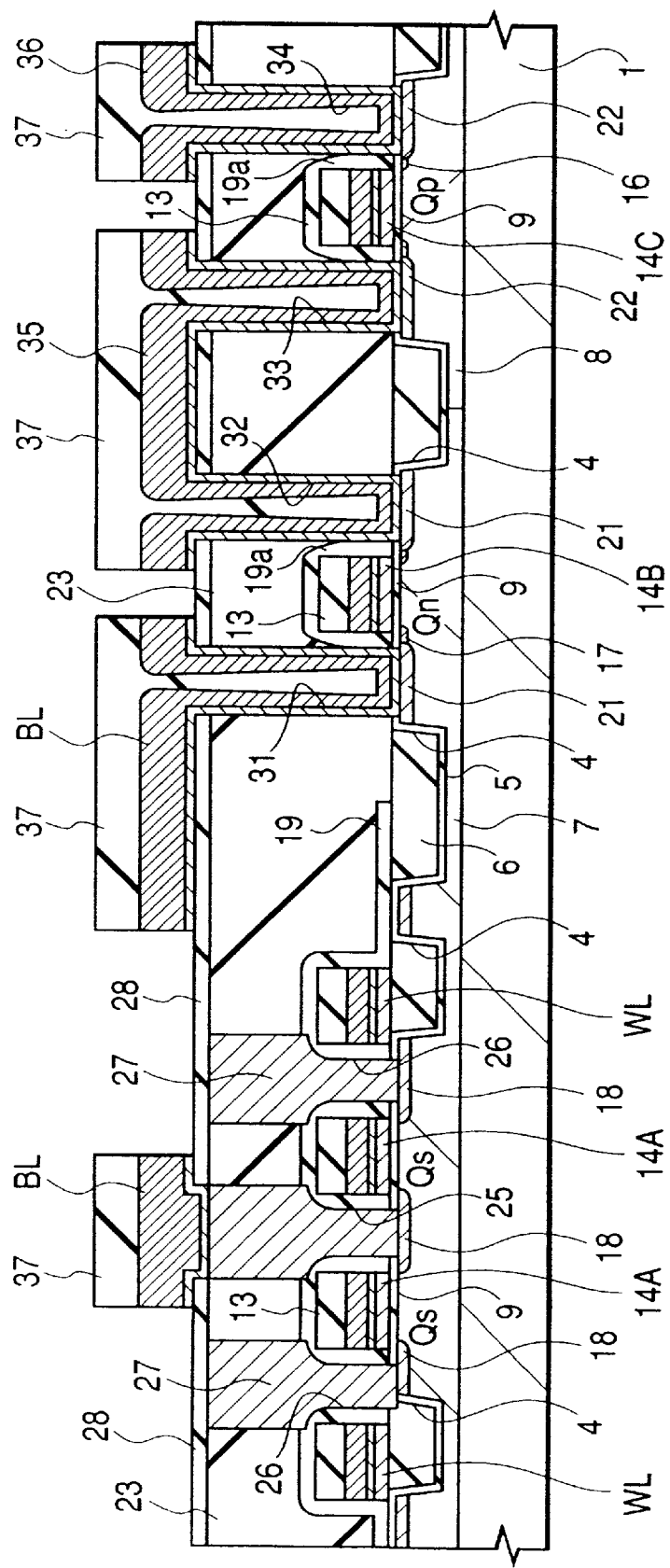
FIG. 22 is a section of the essential portion of the semiconductor substrate and shows a step in the DRAM manufacturing process according to the invention.

Next, the bit lines BL and first-layer wiring lines 35 and 36 of the peripheral circuit are formed over the silicon oxide film 28, as shown in FIG. 22. These bit lines BL and first-layer wiring lines 35 and 36 are formed, for example, by depositing a TiN film and a W film on the silicon oxide film 28 by the sputtering method, by depositing a silicon oxide film 37 on the W film by the CVD method, and by patterning those deposited films sequentially by etching using a photoresist film as a mask.

Figure 23:
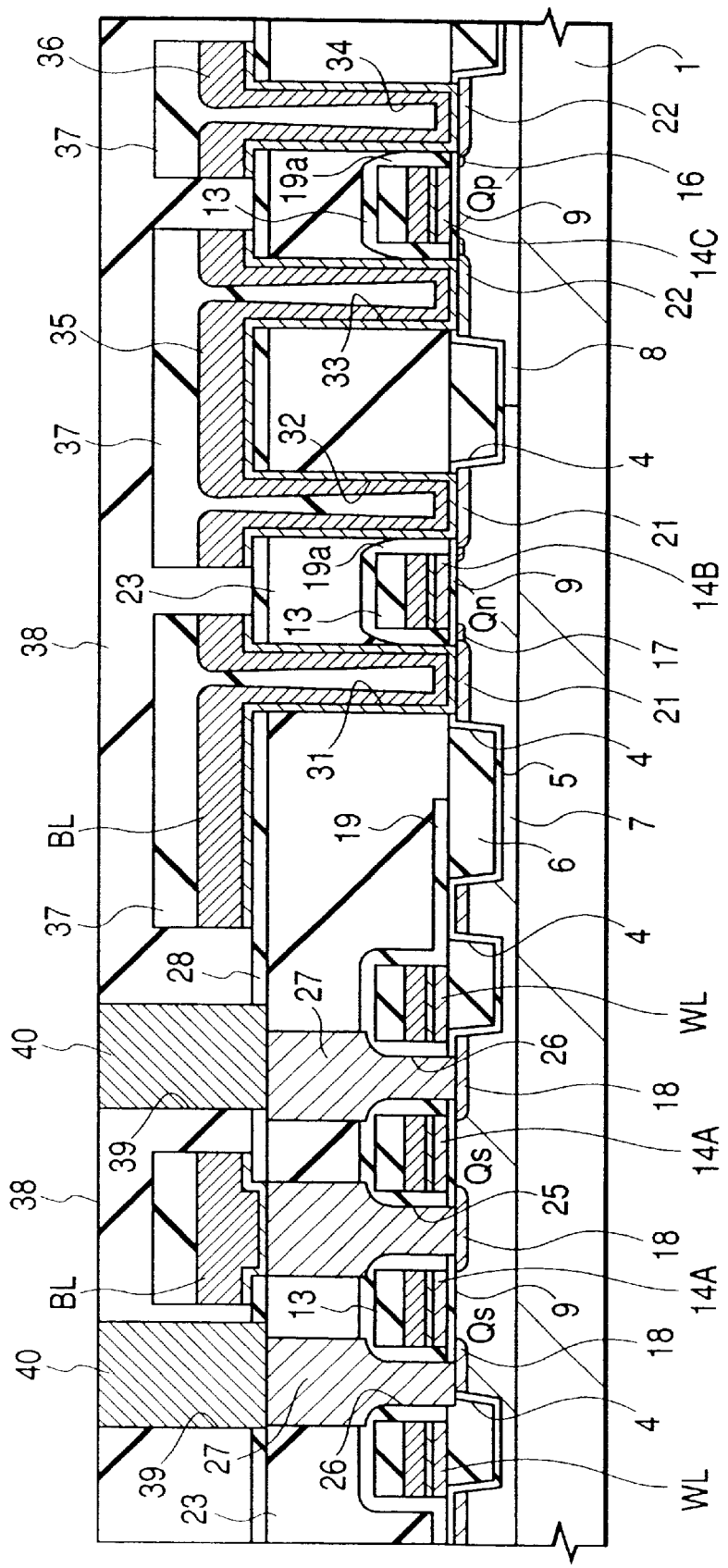
FIG. 23 is a section of the essential portion of the semiconductor substrate and shows a step in the DRAM manufacturing process according to the invention.

Next, a silicon oxide film 38 is deposited on the bit lines BL and the first-layer wiring lines 35 and 36 by the CVD method, as shown in FIG. 23, and the silicon oxide films 38 and 28 over the contact holes 27 are removed by dry-etching using the photoresist film as a mask to form through holes 39. After this, plugs 40 are buried in the through holes 39. The plugs 40 are formed, for example, by depositing the W film on the silicon oxide film 38 by the sputtering method and by polishing the W film by a chemical mechanical polishing method to leave it in the through holes 39.

Figure 24:
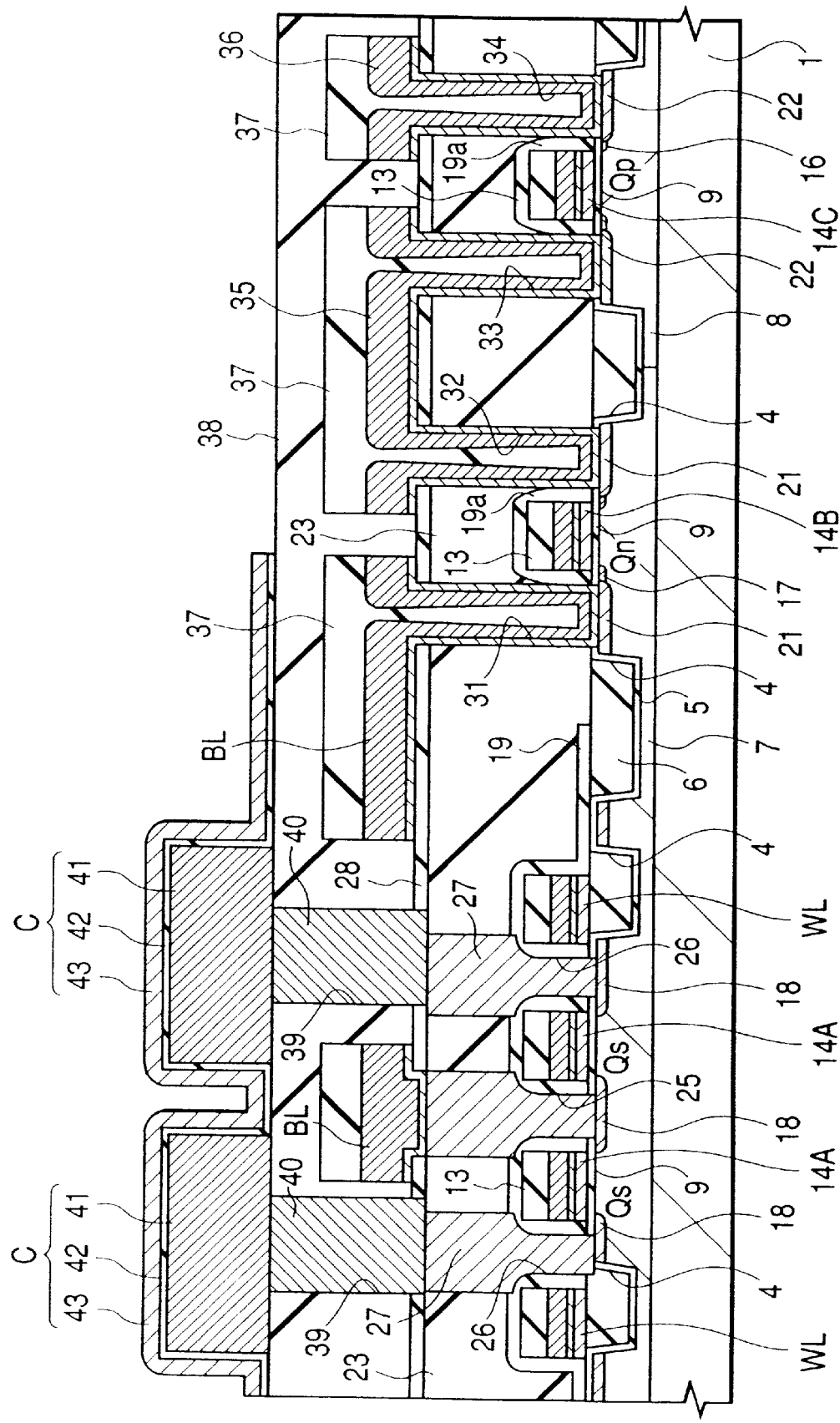
FIG. 24 is a section of the essential portion of the semiconductor substrate and shows a step in the DRAM manufacturing process according to the invention.

Next, an information storing capacity element C, as constructed of a laminated structure of a lower electrode 41, a capacity insulating film 42 and an upper electrode 43, is formed over the through holes 39, as shown in FIG. 24, to substantially complete a memory cell of the DRAM, as constructed of the memory cell selecting MISFET Qs and the information storing capacity element C connected in series with the MISFET Qs. The lower electrode 41 of the information storing capacity element C is formed, for example, by depositing the W film on the silicon oxide film 38 by the CVD method or the sputtering method and by patterning the W film by dry-etching using the photoresist film as a mask. The capacity insulating film 42 and the upper electrode 43 are formed by depositing a tantalum oxide film on the lower electrode 41 by the CVD method or the sputtering method, by depositing a TiN film on the tantalum film by the sputtering method, and by patterning those films sequentially by etching using the photoresist film as a mask.

Figure 25:
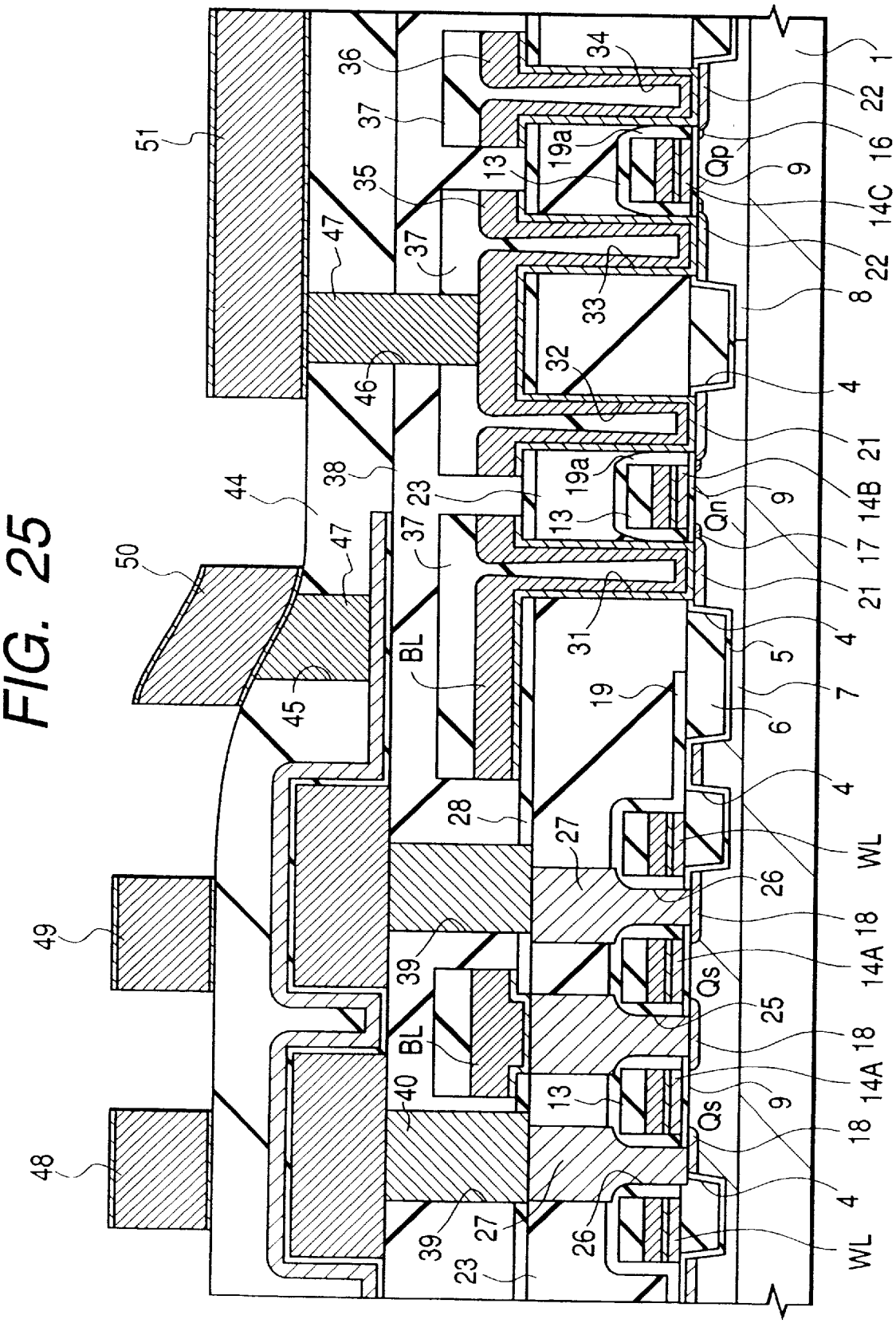
FIG. 25 is a section of the essential portion of the semiconductor substrate and shows a step in the DRAM manufacturing process according to the invention.

Next, a silicon oxide film 44 is deposited on the information storing capacity element C by the CVD method, as shown in FIG. 25, and through holes 45 and 46 are formed over the information storing capacity element C and the first-layer wiring line 35 of the peripheral circuit by dry-etching using the photoresist film as a mask. After this, plugs 47 are buried in the through holes 45 and 46. These plugs 47 are formed, for example, by depositing a W film on the silicon oxide film 44 by the sputtering method and by polishing the W film by the chemical mechanical polishing method to leave it in the through holes 45 and 46. Next, a TiN film, an Al (aluminum) film and a TiN film are sequentially deposited on the silicon oxide film 44 by the sputtering method and are then patterned by dry-etching using the photoresist film as a mask to form second-layer wiring lines 48 to 51.

Figure 26:
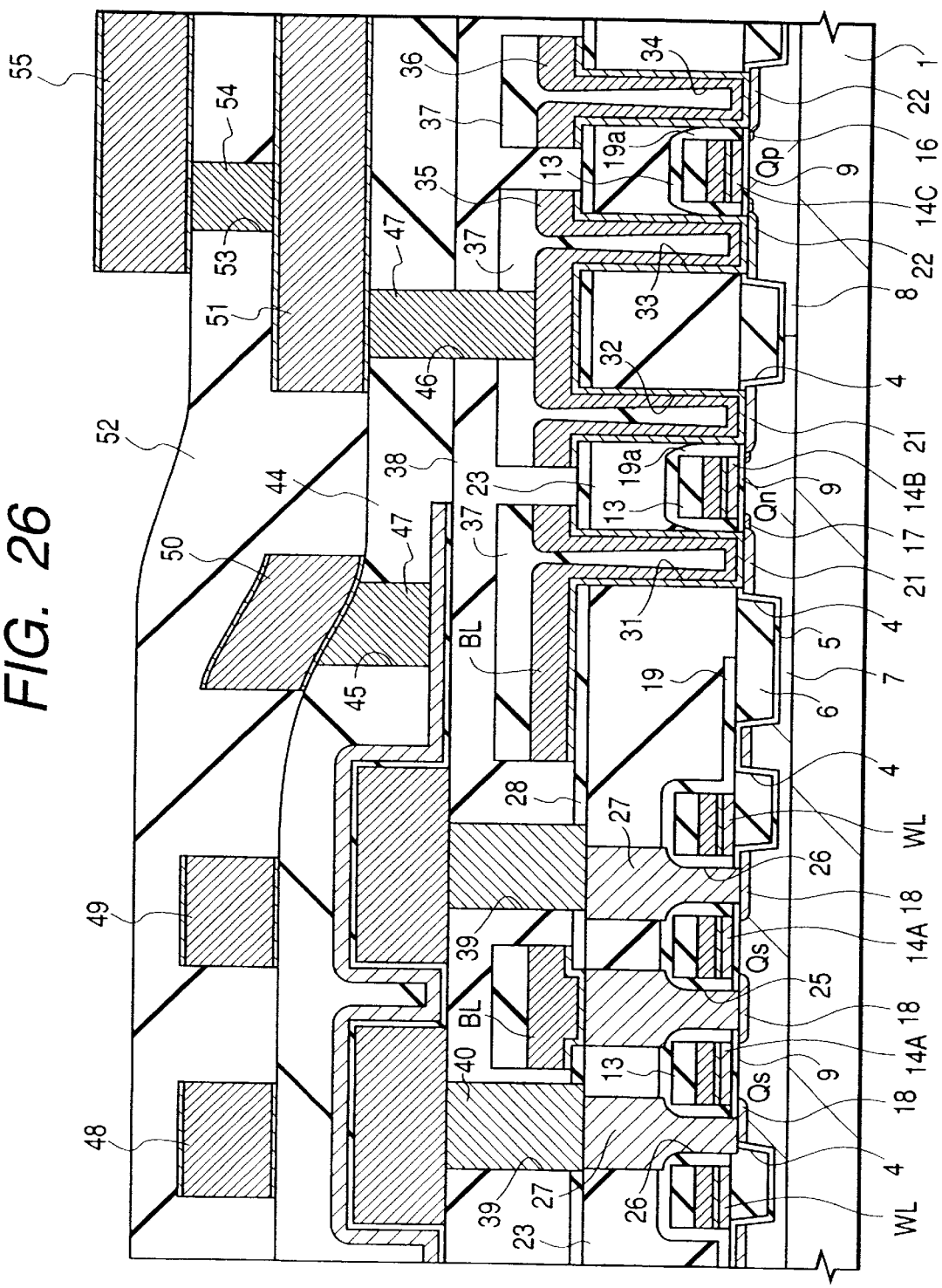
FIG. 26 is a section of the essential portion of the semiconductor substrate and shows a step in the DRAM manufacturing process according to the invention.

Next, a silicon oxide film 52 is deposited on the second-layer wiring lines 48 to 51 by the CVD method, as shown in FIG. 26, and through holes 53 are formed over the second-layer wiring line 51 by dry-etching using the photoresist film as a mask. After this, plugs 54 are buried in the through holes 53. These plugs 54 are formed, for example, by depositing a W film on the silicon oxide film 53 and by polishing the W film by the chemical mechanical polishing method to leave it in the through holes 53. Next, a TiN film, an Al film and a TiN film are sequentially deposited on the silicon oxide film 52 by the sputtering method and are then patterned by dry-etching using the photoresist film as a mask to form a third-layer wiring line 55.

Figure 27:
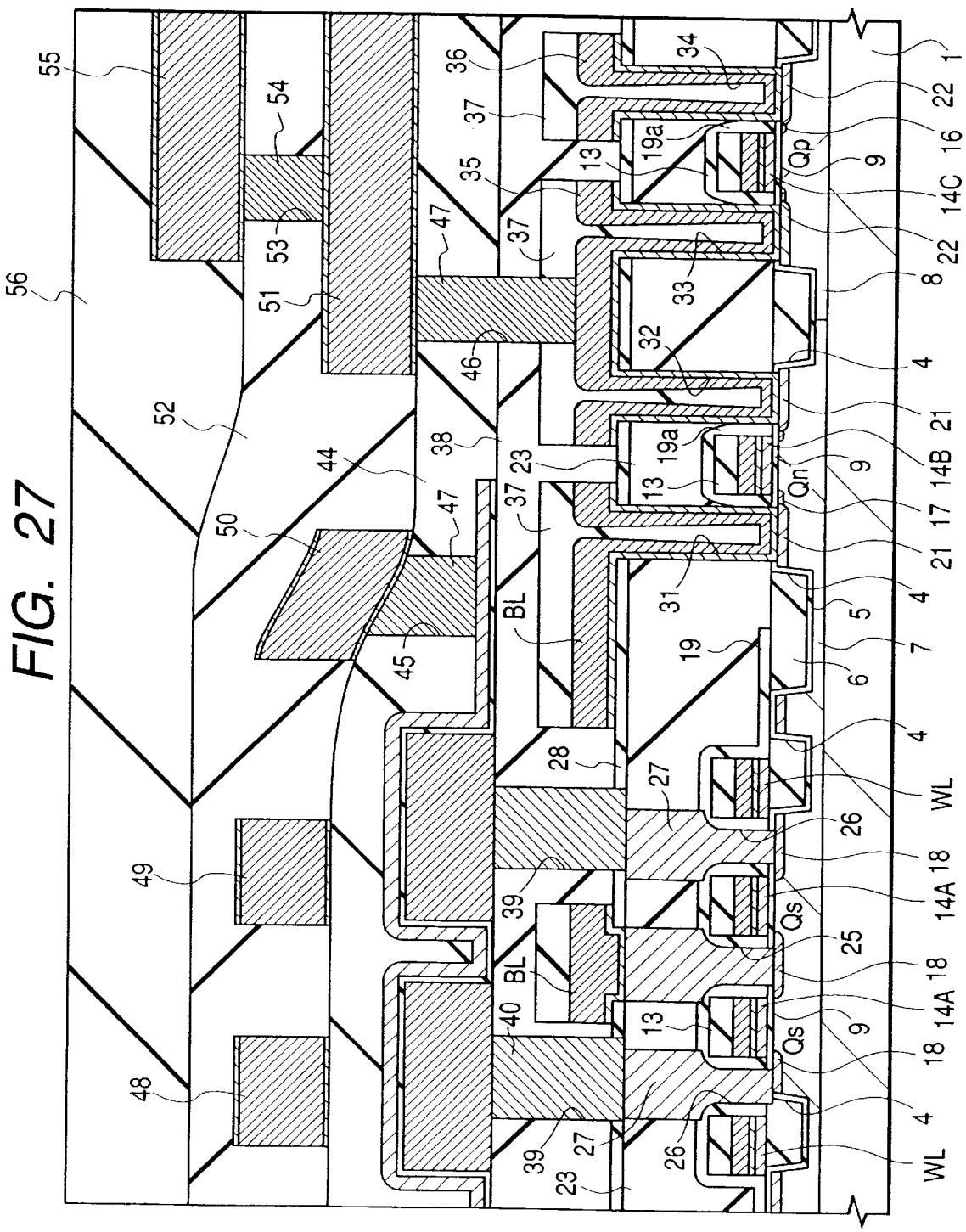
FIG. 27 is a section of the essential portion of the semiconductor substrate and shows a step in the DRAM manufacturing process according to the invention.

Next, a passivation film 56 is deposited on the third-layer wiring line 55, as shown in FIG. 27. This passivation film 56 is constructed of a silicon oxide film and a silicon nitride film which are deposited by the CVD method, for example.

Next, the polycrystalline silicon film and the Si (silicon) substrate, forming portions of the gate electrodes 14A (or word lines WL) and the gate electrodes 14B and 14C, are hydrogen-annealed by a batch type vertical hydrogen annealing furnace 160, as shown in FIG. 28, so that they may be fed with hydrogen.

This hydrogen annealing furnace 160 is equipped with a cylindrical chamber 161 made of a quartz tube. This cylindrical chamber 161 is surrounded by heaters 162a and 162b for heating the semiconductor wafer 1A. A wafer boat 163 carrying a plurality of semiconductor wafers 1A, is mounted in the chamber 161 by running a boat elevator 164 upward.

A predetermined amount of hydrogen gas is introduced into the chamber 161 via a gas inlet pipe 165. This hydrogen gas is introduced, after the completion of the hydrogen annealing of the semiconductor wafer 1A, into the hydrogen gas eliminator 150 via an exhaust pipe 166. At this time, hydrogen gas is introduced via a pipe 167 from the gas reservoir 144a into the hydrogen gas eliminator 150. Between the gas reservoir 144a and the pipe 167, there are interposed a mass flow controller 146e for regulating the mass flow of hydrogen gas and a control valve 147e for opening/closing the passage of the oxygen gas, so that the flow of the oxygen gas to be introduced into the hydrogen gas eliminator 150 is precisely controlled by the controller 146e and the valve 147e. Midway of the exhaust pipe 166, on the other end, there is disposed the check valve 152 for preventing the back flow of the oxygen gas into the chamber 161 of the hydrogen annealing furnace 160.

The hydrogen gas eliminator 150 is equipped with the same reactor (141b) as that shown in FIG. 11. Specifically, the reactor of the hydrogen gas eliminator 150 is made of a heat-/corrosion-resisting alloy and houses a coil made of a catalytic metal such as Pt, Ni or Pd and a heater for heating the coil. The hydrogen gas and the oxygen gas, as introduced into the reactor, are excited in contact with the coil heated to about 350 to 450° C., so that the hydrogen radicals generated from the hydrogen molecules and the oxygen radicals generated from the oxygen molecules quickly react to generate water (or steam).

When the hydrogen gas, as discharged from the hydrogen annealing furnace 160, is to be introduced into the reactor of the hydrogen gas eliminator 150, therefore, a simultaneous introduction is made of oxygen of at least one half (at mole ratio) of the hydrogen so that the hydrogen gas can be completely oxidized into water. This oxygen gas may be either introduced into the reactor prior to the introduction of the hydrogen gas or continuously fed to the inside of the reactor at all times via the pipe 167. The water (or steam) thus generated in the reactor is discharged together with the excessive oxygen gas to the outside via the exhaust pipe 153. Midway of this exhaust pipe 153, there are disposed the hydrogen gas sensor 154 for confirming whether or not the hydrogen gas has been completely converted into water and the cooler 155 for liquefying the hot steam being discharged.

Next, one example of the sequence of the hydrogen annealing process using the hydrogen annealing furnace 160 will be described with reference to FIG. 29.

First of all, the wafer boat 163, loaded with a plurality of semiconductor wafers 1A, is mounted in the chamber 161 of the hydrogen annealing furnace 160. After this, the purge gas (or nitrogen gas) is introduced into the chamber 161 via the gas inlet pipe 165 to interchange the gases sufficiently, and the heaters 162a and 162b are used to heat the semiconductor wafers 1A to about 400° C. Next, the hydrogen gas is introduced via the gas inlet pipe 165 into the chamber 161 so that the semiconductor wafers 1A are heat treated for about 30 minutes to terminate the dangling bonds of Si with the hydrogen.

Next, the purge gas is introduced into the chamber 161 to discharge the unnecessary hydrogen gas to the outside via the exhaust pipe 166. After this, the wafer boat 163 is extracted from the hydrogen annealing furnace 160 to unload the semiconductor wafers 1A.

On the other hand, the hydrogen gas, discharged from the chamber 161 via the exhaust pipe 166, is fed together with the oxygen gas, as fed via the pipe 167, to the reactor of the hydrogen gas eliminator 150 so that the oxygen gas and the hydrogen gas are converted into water (or steam) by catalytic action. This steam is forcibly discharged together with the excessive oxygen gas to the outside via the exhaust pipe 153 so that it is liquefied by the cooler 155. After this, the oxygen gas is discharged to the outside via the exhaust duct, and the water is discharged via the drain.

Here, the hydrogen gas may be oxidized with dry air in place of the oxygen gas. Considering the content (about 21%) of oxygen in the air, the dry air containing oxygen of at least one half (in mole ratio) of the amount of hydrogen is introduced into the reactor so that the hydrogen gas can be completely converted into water.

Although our invention has been specifically described in connection with various embodiments, it should not be limited thereto but can naturally be modified in various manners without departing from the gist thereof.

Figure 30:
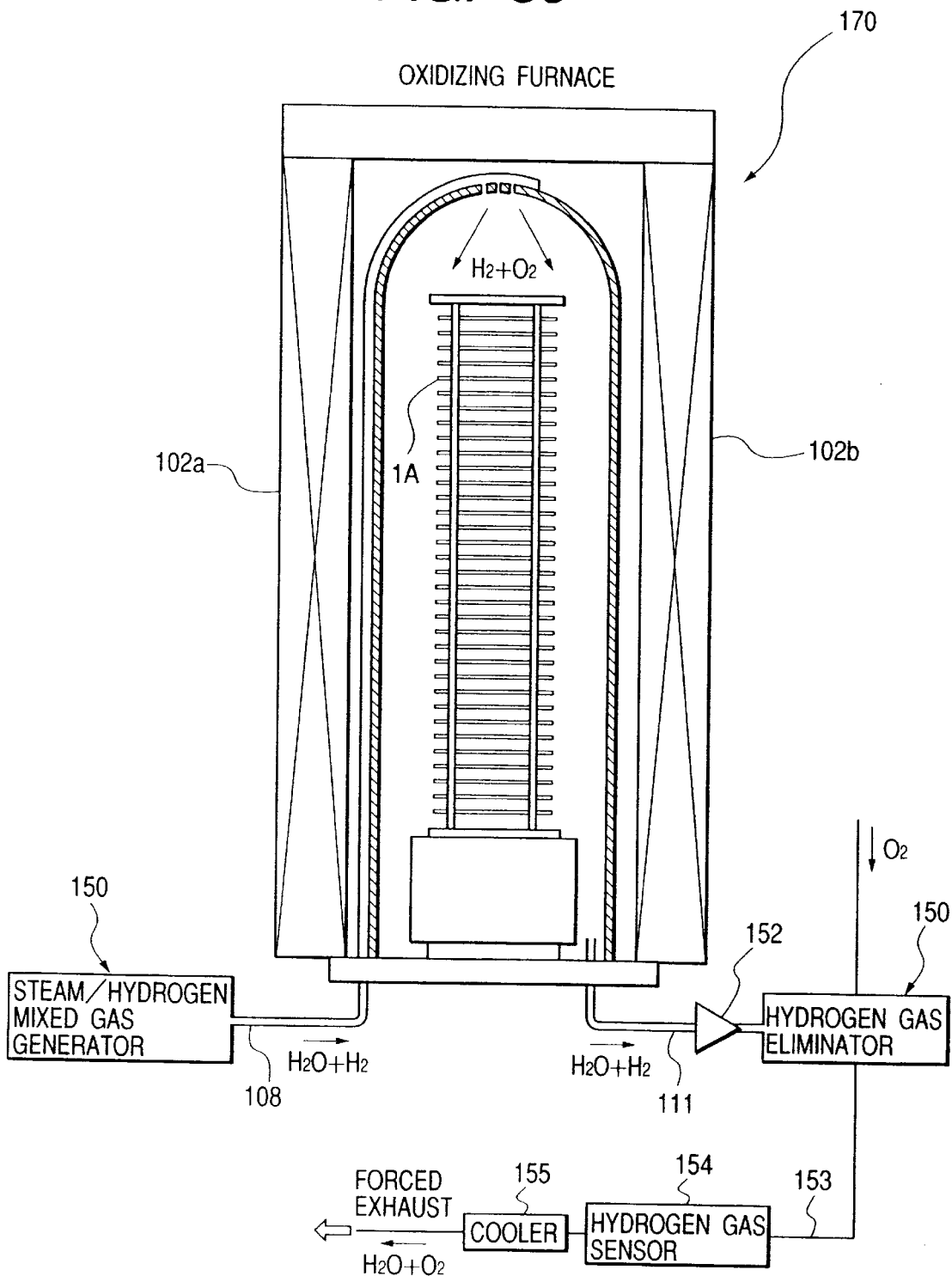
FIG. 30 is a schematic diagram showing a batch type vertical oxidizing furnace to be used for light oxidation treatment.
Figure 31:
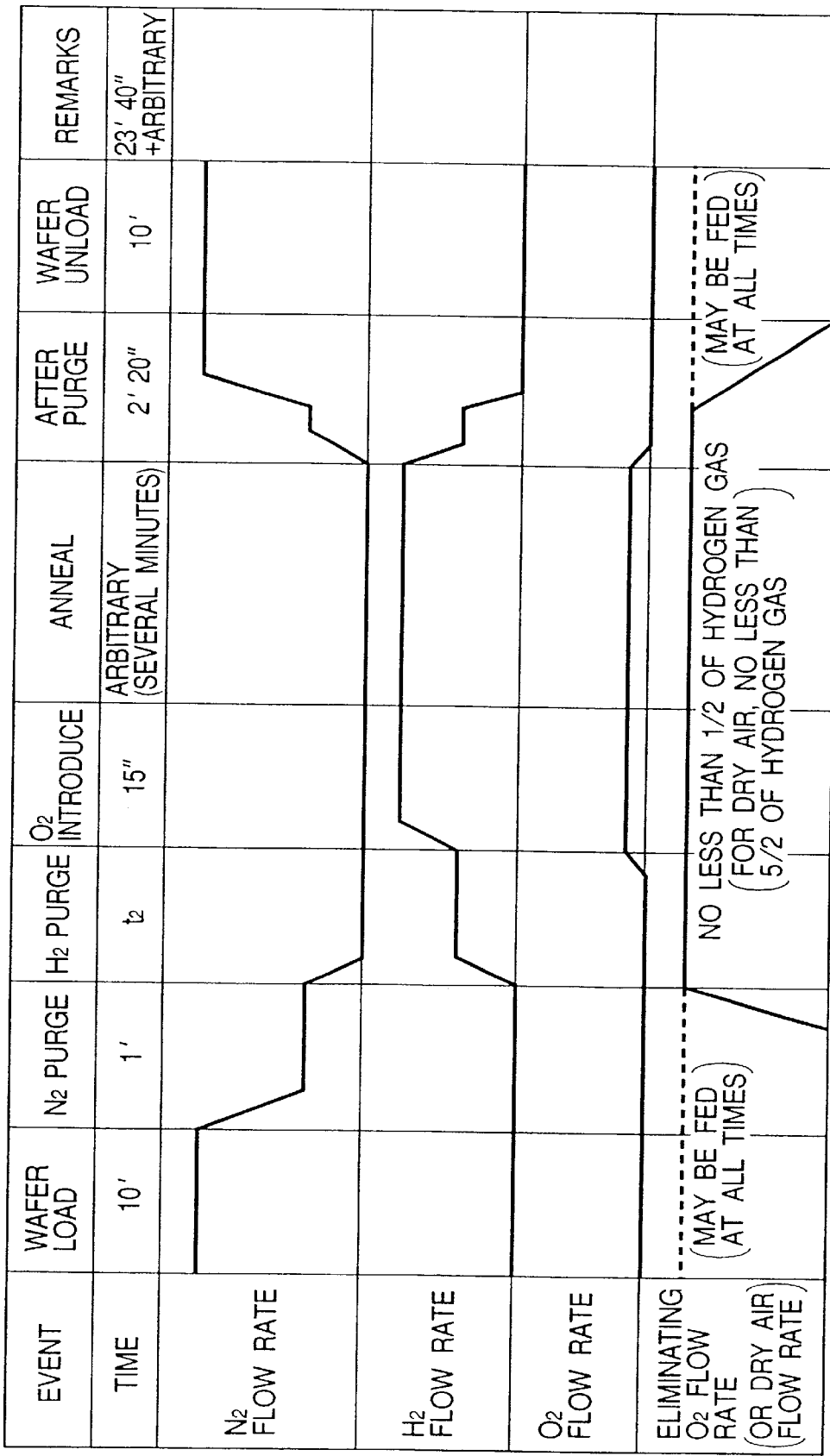
FIG. 31 is a diagram showing a sequence of the light oxidation process using the batch type vertical oxidizing furnace.

The aforementioned light oxidation of the gate oxide film can be performed by connecting the catalytic steam/hydrogen mixed gas generator 140 and the hydrogen gas eliminator 150 to a batch type vertical oxidizing furnace 170 as shown in FIG. 30. The light oxidation process using this batch type vertical oxidizing furnace 170 is exemplified in FIG. 31.

Alternatively, the hydrogen in the exhaust gas could be eliminated by connecting the hydrogen gas eliminator 150 to the exhaust line of an oxidizing furnace for processing the steam/hydrogen mixed gas which is generated by the so-called "bubbling system" of introducing the hydrogen gas into pure water contained in a container.

The foregoing embodiment has been described on both the elimination of the hydrogen gas which is discharged at the light oxidation step of the MOSFETs and the hydrogen gas which is discharged at the hydrogen annealing after the passivation film was formed. The invention should not be limited thereto but could be applied to the elimination of the hydrogen gas which is discharged at a variety of hydrogen annealing steps to be performed in the semiconductor manufacturing process, such as a hydrogen annealing step for forming a non-defective layer on the surface of a Si wafer formed by the CZ (Czochralski) method, a hydrogen annealing step after an epitaxial layer was formed on the surface of a Si wafer, or a hydrogen annealing step to be performed in the course of the process for measuring the electric characteristics of a Si wafer.

On the other hand, the hydrogen gas elimination efficiency may be improved by concentrating the exhaust lines of a plurality of oxidizing furnaces and hydrogen annealing furnaces at one location and by connecting the hydrogen gas eliminator to a midway point of the exhaust lines. When one hydrogen gas eliminator is connected to the exhaust line of one oxidizing furnace or to the exhaust line of one hydrogen annealing furnace, as in the foregoing embodiment, on the other hand, the passage from the oxidizing furnace or the hydrogen annealing furnace to the hydrogen gas eliminator can be shortened to improve the safety.

The effects to be achieved by a representative aspect of the invention disclosed herein will be briefly described in the following.

According to the hydrogen eliminating process of the invention, the hydrogen in the exhaust gas to be discharged from a gas-phase processing apparatus can be completely converted into water so that the hydrogen in the exhaust gas can be completely eliminated without any possibility that unburned hydrogen will be discharged to the outside, unlike the hydrogen eliminating process according to the combustion method.

According to the hydrogen eliminating process of the invention, moreover, the eliminator can be made smaller to lower the cost for manufacturing the apparatus even more than either the elimination process, in which the hydrogen gas to be discharged from the gas-phase processing apparatus is diluted with much nitrogen gas or air and discharged to the atmosphere, or the combustion process.

What is claimed is:

1. A method for manufacturing semiconductor devices, comprising the steps of:
    (a) performing heat treatment, under a gas ambient including hydrogen gas, on a wafer placed in a reaction furnace;
    (b) discharging the gas ambient from the reaction furnace; and
    (c) transforming hydrogen gas included in the discharged gas ambient into water by treating the discharged gas ambient with an oxidizing catalyst.

2. A method for manufacturing semiconductor devices according to claim 1, wherein the transformation of the hydrogen gas into water is performed at a temperature lower than the ignition point of hydrogen and oxygen gas mixtures.

3. A method for manufacturing semiconductor devices according to claim 2, wherein the oxidizing catalyst is disposed in the vicinity of the reaction furnace.

4. A method for manufacturing semiconductor devices according to claim 3, wherein the heat treatment is performed at a temperature higher than 800° C.

5. A method for manufacturing semiconductor devices, comprising the steps of:
    (a) performing heat treatment, under a gas ambient including flammable gas, on a wafer placed in a reaction furnace;
    (b) discharging the gas ambient from the reaction furnace; and
    (c) transforming the flammable gas included in the gas ambient into only at least one nonflammable gas, by treating the discharged gas ambient with an oxidizing catalyst.

6. A method for manufacturing semiconductor devices according to claim 5, wherein the oxidizing catalyst is disposed in the vicinity of the reaction furnace.

7. A method for manufacturing semiconductor devices according to claim 6, wherein the heat treatment is performed at a temperature higher than 800° C.

8. A method for manufacturing semiconductor devices, comprising the steps of:
    (a) performing heat treatment, under a gas ambient including (1) water vapor synthesized with a synthesizing catalyst and (2) flammable gas, on a wafer placed in a reaction furnace;
    (b) discharging the gas ambient from the reaction furnace; and
    (c) transforming the flammable gas included in the discharged gas ambient into only at least one nonflammable gas, by treating the discharged gas ambient with an oxidizing catalyst.

9. A method for manufacturing semiconductor devices according to claim 8, wherein the synthesizing and oxidizing catalysts are respectively disposed in the vicinity of the reaction furnace.

10. A method for manufacturing semiconductor devices according to claim 9, wherein the heat treatment is performed at a temperature higher than 800° C.

11. A method for manufacturing semiconductor devices, comprising the steps of:

(a) performing heat treatment, under a gas ambient including hydrogen gas and water vapor, on a wafer placed in a reaction furnace, said wafer having a first region including silicon as a principal component and a second region not including silicon as a principal component, thereby selectively thermally oxidizing the first region;

(b) discharging the gas ambient from the reaction furnace; and (c) transforming hydrogen gas included in the discharged gas ambient into water, by treating the discharged gas ambient with an oxidizing catalyst.

12. A method for manufacturing semiconductor devices according to claim 11, wherein the transformation of the hydrogen gas into water is performed at a temperature lower than the ignition point of hydrogen and oxygen gas mixtures.

13. A method for manufacturing semiconductor devices according to claim 12, wherein the oxidizing catalyst is disposed in the vicinity of the reaction furnace.

14. A method for manufacturing semiconductor devices according to claim 13, wherein the heat treatment is performed at a temperature higher than 800° C.

15. A method for manufacturing semiconductor devices, comprising the steps of:

(a) performing heat treatment, under a gas ambient including hydrogen gas and water vapor, on a wafer placed in a reaction furnace, said wafer having a first region and a second region which is different from the first region in its material, thereby selectively thermally oxidizing the first region;

(b) discharging the gas ambient from the reaction furnace; and (c) transforming hydrogen gas included in the discharged gas ambient into water, by treating the discharged gas ambient with an oxidizing catalyst.

16. A method for manufacturing semiconductor devices according to claim 15, wherein the transformation of the hydrogen gas into water is performed at a temperature lower than the ignition point of hydrogen and oxygen gas mixtures.

17. A method for manufacturing semiconductor devices according to claim 16, wherein the oxidizing catalyst is disposed in the vicinity of the reaction furnace.

18. A method for manufacturing semiconductor devices according to claim 17, wherein the heat treatment is performed at a temperature higher than 800° C.

19. A method for manufacturing semiconductor devices, comprising the steps of:

(a) performing heat treatment, under a gas ambient including flammable gas, on a wafer placed in a reaction furnace;

(b) discharging the gas ambient from the reaction furnace; and (c) transforming the flammable gas included in the discharged gas ambient into only at least one nonflammable gas by treating the discharged gas ambient with an oxidizing catalyst disposed in the vicinity of the reaction furnace.

20. A method for manufacturing semiconductor devices according to claim 19, wherein the transformation of the hydrogen gas into water is performed at a temperature lower than the ignition point of hydrogen and oxygen gas mixtures.

21. A method for manufacturing semiconductor devices according to claim 20, wherein the heat treatment is performed at a temperature higher than 800° C.

22. A method for manufacturing semiconductor devices, comprising the steps of:

(a) forming a silicon film over a gate insulation film having a silicon oxide film formed over a silicon surface of a major surface of a wafer;

(b) forming a refractory metal film including tungsten as a principal component over the silicon film, through the medium of a barrier layer;

(c) forming a gate electrode by patterning the silicon film and the refractory metal film;

(d) after step (c), thermally oxidizing the silicon and silicon portions of the wafer placed in a thermal oxidizing region under a mixed gas ambient including (1) water vapor, synthesized with a synthesizing catalyst from hydrogen gas and oxygen gas, and (2) hydrogen gas;

(e) discharging the mixed gas ambient from the thermal oxidizing region; and (f) transforming hydrogen gas included in the discharged mixed gas ambient into water by treating the discharged mixed gas ambient with an oxidizing catalyst.

23. A method for manufacturing semiconductor devices according to claim 22, wherein the thermal oxidation is performed in a reaction furnace, and wherein the synthesizing and oxidizing catalysts are respectively disposed in the vicinity of the reaction furnace.

24. A method for manufacturing semiconductor devices according to claim 23, wherein the thermal oxidation in step (d) is performed at a temperature higher than 800° C.

25. A method for manufacturing semiconductor devices, comprising the steps of:

(a) forming a silicon film over a gate insulation film having a silicon oxide film formed over a silicon surface of a major surface of a wafer;

(b) forming a refractory metal film over the silicon film, through the medium of a barrier layer;

(c) forming a gate electrode by patterning the silicon film and the refractory metal film;

(d) after step (c), thermally oxidizing the silicon and silicon portions of the wafer placed in a thermal oxidizing region under a mixed gas ambient including (1) water vapor, synthesized with a synthesizing catalyst from hydrogen gas and oxygen gas, and (2) hydrogen gas;

(e) discharging the mixed gas ambient from the thermal oxidizing region; and (f) transforming hydrogen gas included in the discharged mixed gas ambient into water by treating the discharged mixed gas ambient with an oxidizing catalyst.

26. A method for manufacturing semiconductor devices according to claim 25, wherein the thermal oxidation is performed in a reaction furnace, and wherein the synthesizing and oxidizing catalysts are respectively disposed in the vicinity of the reaction furnace.

27. A method for manufacturing semiconductor devices according to claim 26, wherein the thermal oxidation in step (d) is performed at a temperature higher than 800° C.

28. A method for manufacturing semiconductor devices, comprising the steps of:

(a) performing heat treatment, under a mixed gas ambient including (1) water vapor, synthesized with a synthesizing catalyst from hydrogen gas and oxygen gas, and (2) hydrogen gas, on a wafer placed in a thermal oxidizing region, said wafer having a first region and a second region which is different from the first region in its material, thereby selectively thermally oxidizing the first region without oxidizing the second region;

(b) discharging the gas ambient from the thermal oxidizing region; and (c) transforming hydrogen gas included in the discharged gas ambient into water by treating the discharged gas ambient with an oxidizing catalyst.

29. A method for manufacturing semiconductor devices, comprising the steps of:

(a) forming a first film including silicon as a principal component over a gate insulation film having a silicon oxide film formed over a silicon surface of a major surface of a wafer;

(b) forming a refractory metal film over the first film, through the medium of a barrier layer;

(c) forming a gate electrode by patterning the first film and the refractory metal film;

(d) after step (c), thermally oxidizing a silicon portion of the first film of the wafer placed in a thermal oxidizing region under a mixed gas ambient including (1) water vapor, synthesized with a synthesizing catalyst from hydrogen gas and oxygen gas, and (2) hydrogen gas;

(e) discharging the mixed gas ambient from the thermal oxidizing region; and (f) transforming hydrogen gas included in the discharged mixed gas ambient into water by treating the discharged mixed gas ambient with an oxidizing catalyst.

30. A method for manufacturing semiconductor integrated circuit devices, comprising the steps of:

(a) forming an isolation groove in a silicon surface of a major surface of a wafer;

(b) forming an insulating material film so as to fill in the isolation groove;

(c) after step (b), planarizing the major surface by chemical mechanical polishing;

(d) forming a silicon film over a gate insulating film having a silicon oxide film formed over the silicon surface;

(e) forming a refractory metal film over the silicon film, through the medium of a barrier layer;

(f) forming a gate electrode by patterning the silicon film and the refractory metal film;

(g) after step (f), thermally oxidizing the silicon film over the wafer placed in a thermal oxidizing region under a mixed gas ambient including water vapor and hydrogen gas without oxidizing the refractory metal film;

(h) discharging the mixed gas ambient from the thermal oxidizing region; and (i) transforming the hydrogen gas included in the discharged mixed gas ambient into water by treating the discharged mixed gas ambient with an oxidizing catalyst.

31. A method for manufacturing complementary semiconductor integrated circuit devices, comprising the steps of:

(a) forming a silicon film over a gate insulation film having a silicon oxide film formed over a silicon surface of a major surface of a wafer;

(b) forming a refractory metal film including tungsten as a principal component over the silicon film, through the medium of a barrier layer including a tungsten nitride film;

(c) forming a gate electrode by patterning the silicon film, the barrier layer and the refractory metal film;

(d) after step (c), thermally oxidizing the silicon film over the wafer placed in a thermal oxidizing region under a mixed gas ambient including water vapor and hydrogen gas without oxidizing the refractory metal film;

(e) discharging the mixed gas ambient from the thermal oxidizing region; and (f) transforming the hydrogen gas included in the discharged mixed gas ambient into water by treating the discharged mixed gas ambient with an oxidizing catalyst.

32. A method for manufacturing complementary semiconductor integrated circuit devices, comprising the steps of:

(a) forming a silicon film over a gate insulation film having a silicon oxide film formed over a silicon surface of a major surface of a wafer;

(b) forming a refractory metal film including tungsten as a principal component over the silicon film, through the medium of a barrier layer including a tungsten nitride film;

(c) forming a gate electrode by patterning the silicon film, the barrier layer and the refractory metal film;

(d) after step (c), thermally oxidizing the silicon film over the wafer placed in a thermal oxidizing region under a mixed gas ambient including gases oxidative and reductive to the silicon film and the refractory metal film without oxidizing the refractory metal film;

(e) discharging the mixed gas ambient from the thermal oxidizing region; and (f) transforming the discharged mixed gas ambient into a nonflammable gas by treating the discharged mixed gas ambient with an oxidizing catalyst.

33. A method for manufacturing semiconductor devices, comprising the steps of:

(a) forming a silicon film over a gate insulation film having a silicon oxide film formed over a silicon surface of a major surface of a wafer;

(b) forming a refractory metal film including tungsten as a principal component over the silicon film, through the medium of a barrier layer;

(c) forming a gate electrode by patterning the silicon film and the refractory metal film;

(d) after step (c), thermally oxidizing the silicon film over the wafer placed in a thermal oxidizing region under a mixed gas ambient including a first gas oxidative to the silicon film and the refractory metal film, said first gas being synthesized with a synthesizing catalyst, and a second gas reductive to the silicon film and the refractory metal film, without oxidizing the refractory metal film;

(e) discharging the mixed gas ambient from the thermal oxidizing region; and (f) transforming the discharged mixed gas ambient into a nonflammable gas by treating the discharged mixed gas ambient with an oxidizing catalyst.

34. A method for manufacturing semiconductor devices, comprising the steps of:

(a) performing heat treatment under a gas ambient including hydrogen gas on a wafer placed in a reaction furnace, the wafer having a passivation film at a higher level than a bonding pad layer;

(b) discharging the gas ambient from the reaction furnace; and (c) transforming the hydrogen gas included in the discharged gas ambient into water by treating the discharged gas ambient with an oxidizing catalyst.

35. A method for manufacturing semiconductor devices, comprising the steps of:

(a) performing heat treatment under a gas ambient including hydrogen gas and water vapor on a wafer placed in a reaction furnace;

(b) discharging the gas ambient from the reaction furnace;

(c) transforming hydrogen gas included in the discharged gas ambient into water by treating the discharged gas ambient with an oxidizing catalyst.

* * * * *